United States Patent
Lanzillo et al.

(10) Patent No.: US 12,417,963 B2
(45) Date of Patent: Sep. 16, 2025

(54) ISOLATION RAIL BETWEEN BACKSIDE POWER RAILS

(71) Applicant: INTERNATIONAL BUSINESS MACHINES CORPORATION, Armonk, NY (US)

(72) Inventors: Nicholas Anthony Lanzillo, Wynantskill, NY (US); Lawrence A. Clevenger, Saratoga Springs, NY (US); Hosadurga Shobha, Niskayuna, NY (US); Ruilong Xie, Niskayuna, NY (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 584 days.

(21) Appl. No.: 18/048,877

(22) Filed: Oct. 24, 2022

(65) Prior Publication Data

US 2024/0136253 A1 Apr. 25, 2024
US 2024/0234248 A9 Jul. 11, 2024

(51) Int. Cl.
*H01L 23/48* (2006.01)
*H01L 21/768* (2006.01)
*H10D 30/67* (2025.01)
*H10D 62/10* (2025.01)
*H10D 62/13* (2025.01)

(52) U.S. Cl.
CPC ...... *H01L 23/481* (2013.01); *H01L 21/76877* (2013.01); *H10D 30/6735* (2025.01); *H10D 30/6757* (2025.01); *H10D 62/121* (2025.01); *H10D 62/151* (2025.01)

(58) Field of Classification Search
CPC ............. H01L 23/481; H01L 21/76877; H01L 23/535; H01L 23/5286; H10D 30/6735; H10D 30/6757; H10D 62/121; H10D 62/151; H10D 64/254
See application file for complete search history.

(56) References Cited

U.S. PATENT DOCUMENTS 7,301,107 B2 11/2007 Karthikeyan
7,760,578 B2 7/2010 Vinke
(Continued)

FOREIGN PATENT DOCUMENTS

TW 202201639 A 1/2022
TW 202213161 A 4/2022
(Continued)

OTHER PUBLICATIONS

Taiwan Search Report and Written Opinion dated Mar. 13, 2024, for TW Application No. 112120006, filed May 30, 2024.

*Primary Examiner* — Jonathan Han
(74) *Attorney, Agent, or Firm* — Matthew Zehrer

(57) ABSTRACT

A semiconductor device includes a backside power rail, a backside ground rail, and a backside isolation rail between the backside power rail and the backside ground rail. The backside isolation rail may provide adequate electrical isolation between the backside power rail and the backside ground rail, thereby enabling the backside power rail and the backside ground rail to be located relatively near to one another. The backside isolation rail may also cure actual electrical shorts between the backside power rail and the backside ground rail.

20 Claims, 28 Drawing Sheets

(56) References Cited

U.S. PATENT DOCUMENTS

| | | |
|---|---|---|
| 9,054,160 B2 | 6/2015 | Bruce |
| 9,490,165 B2 | 11/2016 | Du |
| 9,793,164 B2 | 10/2017 | Machkaoutsan |
| 9,799,553 B2 | 10/2017 | Tung |
| 10,115,633 B2 | 10/2018 | Zhang |
| 10,475,890 B2 | 11/2019 | Wang |
| 10,636,739 B2 | 4/2020 | Beyne |
| 11,075,281 B2 | 7/2021 | Bao |
| 11,195,795 B1 | 12/2021 | Anderson |
| 11,276,639 B2 | 3/2022 | Anderson |
| 2021/0037576 A1 | 2/2021 | Shao et al. |
| 2021/0375761 A1 | 12/2021 | Chang et al. |
| 2021/0391318 A1* | 12/2021 | Peng ................ H10D 84/85 |
| 2021/0399099 A1 | 12/2021 | Chu |
| 2022/0004501 A1 | 1/2022 | Favor et al. |
| 2022/0030226 A1 | 1/2022 | Lee et al. |
| 2022/0045011 A1 | 2/2022 | Sio et al. |
| 2022/0093448 A1 | 3/2022 | Yu |
| 2022/0130759 A1 | 4/2022 | Huang |
| 2022/0302268 A1* | 9/2022 | Chiang ............. H10D 30/6735 |

FOREIGN PATENT DOCUMENTS

| | | |
|---|---|---|
| TW | 202213685 A | 4/2022 |
| TW | 202218046 A | 5/2022 |

\* cited by examiner

ISOLATION RAIL BETWEEN BACKSIDE POWER RAILS

BACKGROUND

The present disclosure relates to fabrication methods and resulting structures for semiconductor devices. More specifically, the present disclosure relates to fabrication methods and resulting structures that are electrically connected to backside power rail(s) that are adequately electrically isolated by a backside isolation rail.

An integrated circuit ("IC") structure can include a compilation of layers with different functionality, such as interconnects, power distribution network, logic chips, memory chips, radio frequency (RF) chips, and the like. By way of example and not limitation, logic chips can include central process units (CPUs) and memory chips can include static access memory (SRAM) arrays, dynamic random-access memory (DRAM) arrays, magnetic random-access memory (MRAM) arrays, other types of memory arrays, or combinations thereof. A three-dimensional (3D) integrated circuit (3D IC) structure is a non-monolithic vertical structure developed based on the IC structure and can include, for example, two to eight two-dimensional (2D) flip chips stacked on top of each other through various bonding techniques, such as hybrid bonding. In IC and 3D IC structures, each of the layers can be interconnected by micro-bumps, through silicon vias (TSVs), hybrid bonding, other types of interconnect structures, or combinations thereof.

IC structures are powered by power wire grids including power lines and ground lines. Power wire grids can be electrically connected to one end of the IC package and supply power to each layer through conductive structures, such as power grid pillars formed by TSVs. However, as more layers are stacked on top of each other, increased layers of TSVs and interconnect structures in IC structures can lead to increased resistances and IR drops (e.g., greater than 5% voltage drop). In addition, TSVs used to deliver power to device layers through interconnect layers can occupy valuable routing space for signal lines, increase the resistance of interconnects and TSVs, deteriorate the performance of the chips, and reduce the lifetime of the IC structures. Adequately electrically isolating a backside power rail from a backside ground rail has been challenging. In one solution, a minimum dimension between the backside power rail and the backside ground rail is administered during design of the IC device to minimize defects, such as tunneling defects and shorts attributed thereto, between the backside power rail and the backside ground rail. In another solution, one or more wiring structures, such as signal lines, may be placed between the backside power rail and the backside ground rail. Known validation tests may determine when shorts exist between the signal line and the power rail or ground rail. However, such known validation tests may not adequately identify whether shorts exist directly between the power rail and ground rail. Therefore, for these or other reasons, backside power rails and backside ground rails have been traditionally spaced relatively far apart.

It should be noted that the structures and methods described in the present application can also be applied to other conductive structures, such as signal carrying wires, ground wires, and any other suitable conductive structures.

SUMMARY

In an embodiment of the present disclosure, a semiconductor device is presented. The semiconductor device includes a substrate and one or more integrated circuit (IC) microdevices upon the substrate. The one or more IC microdevices include a first node and a second node. The semiconductor device includes a first backside contact connected to a portion of a bottom surface of the first node and a second backside contact connected to a portion of a bottom surface of the second node. The semiconductor device includes a backside power rail connected to the first backside contact and a backside ground rail connected to the second node. The semiconductor device includes a backside isolation rail between the backside power rail and the backside ground rail.

In another embodiment of the disclosure, a method of forming a semiconductor device is presented. The method includes forming a backside power rail and a backside ground rail through a dielectric layer. The method further includes, after forming the backside power rail and the backside ground rail, forming a backside isolation rail through the dielectric layer between the backside power rail and the backside ground rail.

In some examples, a top surface of the backside power rail is below a top surface of the backside isolation rail and/or a top surface of the backside ground rail is below a top surface of the backside isolation rail.

In some examples, the backside power rail and the backside ground rail are within a first layer of a first dielectric material and the backside isolation rail is formed of a second dielectric material different than the first dielectric material.

In some examples, a sidewall of the backside power rail abuts against the first dielectric material and a first sidewall of the backside isolation rail abuts against the first dielectric material. Similarly, in some examples, a sidewall of the backside ground rail abuts against the first dielectric material and a second sidewall of the backside isolation rail abuts against the first dielectric material.

In some examples, a front surface of the backside ground rail is coplanar with a front surface of the backside isolation rail and a rear surface of the backside ground rail is coplanar with a rear surface of the backside isolation rail. Similarly, in some examples, a front surface of the backside power rail is coplanar with a front surface of the backside isolation rail and a rear surface of the backside power rail is coplanar with a rear surface of the backside isolation rail.

In some examples, a front surface of the backside power rail and a front surface of the backside ground rail are inset relative to a front surface of the backside isolation rail and a rear surface of the backside power rail and a rear surface of the backside ground rail are inset relative to a rear surface of the backside isolation rail.

In another embodiment of the disclosure, a transistor is presented. The transistor includes one or more channel regions, a gate connected to the one or more channel regions, a first source or drain (S/D) region connected to the one or more channel regions, a second S/D region connected to the one or more channel regions, a first backside contact connected to a bottom surface of the first S/D region and a second backside contact connected to a bottom surface of the second S/D region, a backside power rail connected to the first backside contact and a backside ground rail connected to the second node, and a backside isolation rail between the backside power rail and the backside ground rail.

Generally, these embodiments described herein are directed to reducing IR drops in IC and/or 3D IC structures by utilizing a backside power rail and a backside ground rail. For example, embodiments of the present disclosure include features such as (i) a backside power distribution network (BSPDN) formed on a backside of the IC structure, (ii) a power rail and a ground rail connected to the BSPDN, (iii) an isolation rail between the power rail and the ground rail. The backside power distribution network can provide benefits of, among other things, (i) decrease IR drops from power source to embedded devices; and (ii) increase routing space for signal lines within the interlayer dielectric layer(s). The isolation rail can provide benefits of, among other things, (i) adequate electrical isolation between the power rail and the ground rail when they are directly adjacent (i.e., but for the isolation rail, no signal lines or other similar structures need be placed between the power rail and ground rail to provide adequate dimension therebetween) and (ii) curing actual electrical shorts, or other similar defects, between the power rail and the ground rail.

The above summary is not intended to describe each illustrated embodiment or every implementation or example of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
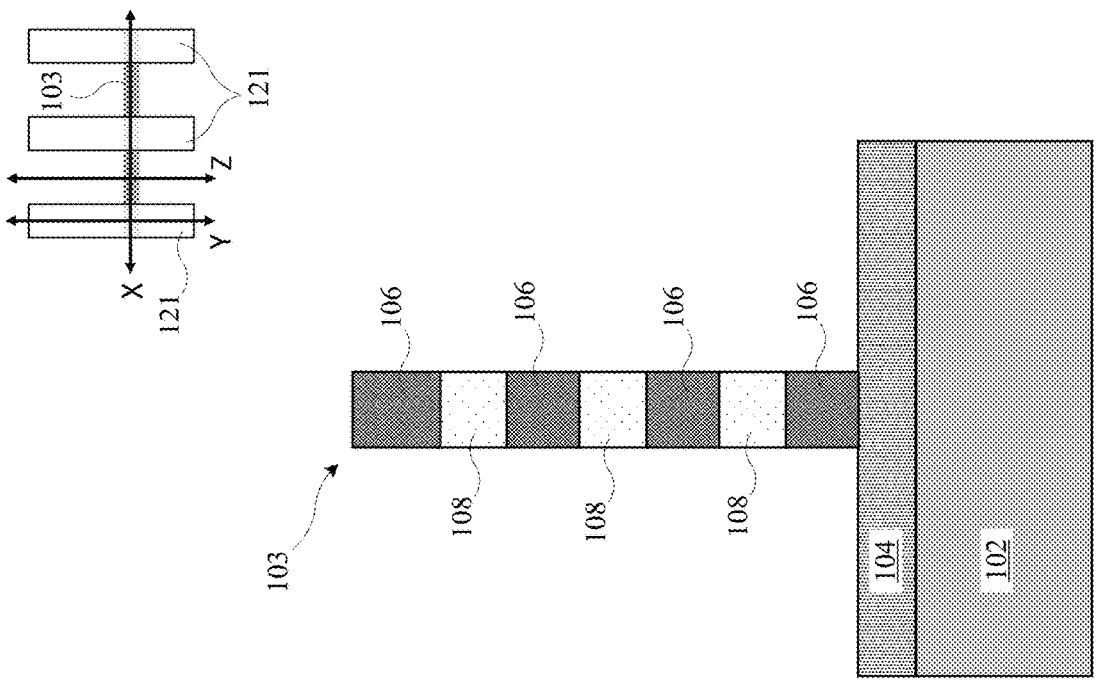
FIG. 1 through FIG. 13 depict various fabrication structure views of an exemplary semiconductor device that includes a backside power rail and a backside ground rail, according to embodiments.
Figure 1:
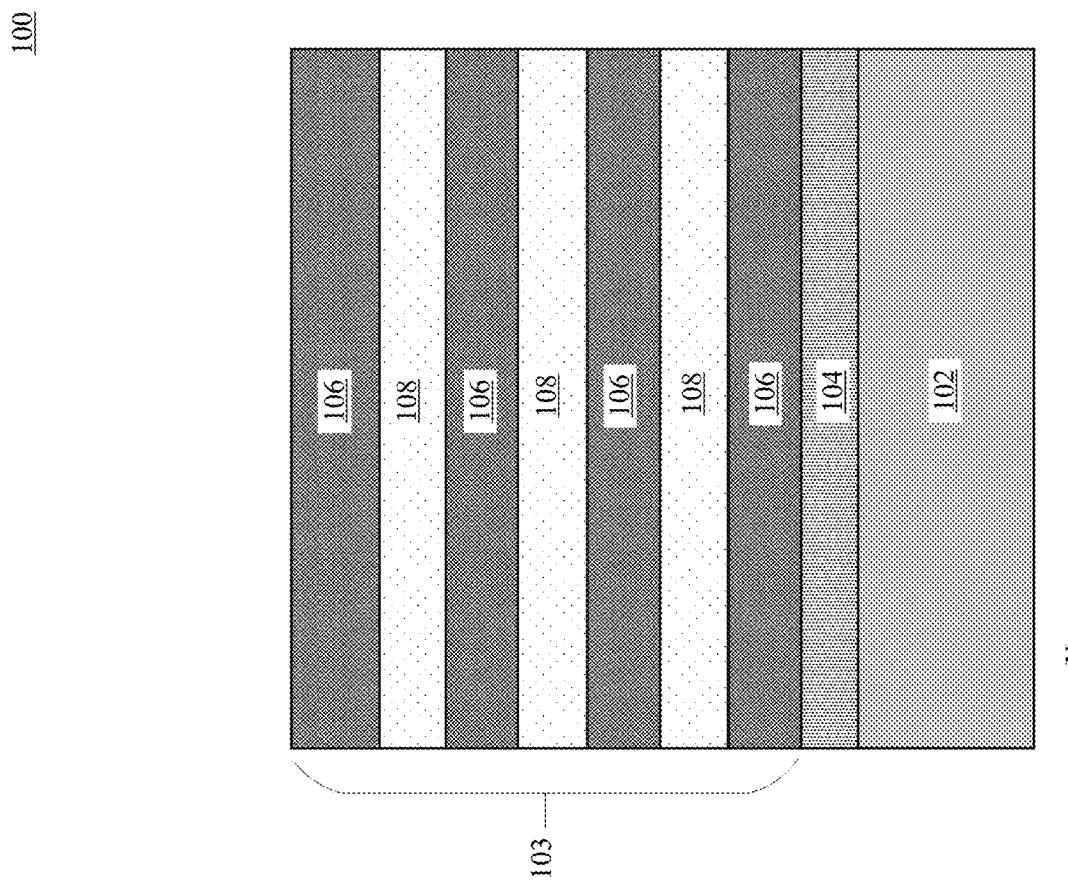

The present disclosure describes an exemplary IC structure that includes a field effect transistor (FET) that is electrically connected to a BSPDN by one or more of a backside power rail and/or a backside ground rail. A FET is one type of IC microdevice. There are many different types of FETs, such as but not limited to FinFETs, gate all around (GAA) FETs, nanowire GAA FETs, nanowire GAA FETs, fork sheet FET, and the like. Other types of IC microdevices may be diodes, gates, storage cells, or the like. Though one exemplary IC microdevice (i.e., a nanowire GAA FET) is depicted in the drawings, embodiments of the present disclosure should not be limited thereto and may be applied to other IC microdevices that may be connected a backside power rail and/or a backside ground rail.

The flowcharts and cross-sectional diagrams in the drawings illustrate methods of fabricating semiconductor device, such as an IC, processor, FPGA, memory module, or the like, according to various embodiments. In some alternative implementations, the fabrication steps may occur in a different order that that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawings. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. Various steps in the manufacture of semiconductor devices are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a GAA nanowire FET provides a relatively small FET footprint by forming the channel region as a series of nano wires. In a known GAA configuration, a nanowire GAA FET includes a source region, a drain region and stacked nanowire channels between the source and drain regions. Semiconductor nanowire FET devices typically include one or more suspended nanowires that serve as the channel. A gate surrounds the stacked nanowire channels and regulates electron flow through the nanowire channels between the source and drain regions. GAA nanowire FETs are fabricated by forming alternating layers of channel nanowires and sacrificial nanowires. The sacrificial nanowires are released from the channel nanowires before the FET device is finalized. For n-type FETs, the channel nanowires are typically silicon (Si) and the sacrificial nanowires are typically silicon germanium (SiGe). For p-type FETs, the channel nanowires can be SiGe and the sacrificial nanowires can be Si. In some implementations, the channel nanowire of a p-type FET can be SiGe or Si, and the sacrificial nanowires can be Si or SiGe. Forming the GAA nanowires from alternating layers of channel nanowires formed from a first type of semiconductor material (e.g., Si for n-type FETs, and SiGe for p-type FETs) and sacrificial nanowires formed from a second type of semiconductor material (e.g., SiGe for n-type FETs, and Si for p-type FETs) provides superior channel electrostatics control, which is necessary for continuously scaling gate lengths.

In certain semiconductor structures, it has been difficult to integrate a backside contact that connects to the applicable IC microdevice and a backside power rail and/or a backside ground rail because, for example, there has been a traditional need for the backside power rail to be relatively distant from the backside ground rail. However, embodiments of the disclosure provide for a backside isolation rail located between the backside power rail and the backside ground rail. As such, the backside power rail and the backside ground rail may be located relatively near to one another and allow for relatively shorter wiring lengths between such rails and the IC microdevice, thereby improving overall device performance.

Referring now to the drawings in which like numerals represent the same or similar elements and initially to FIG. 1, this figure depicts a top-down view and cross-sectional views of a semiconductor device 100 at an intermediate stage of the fabrication process, according to embodiments.

The semiconductor device 100 may be formed over a substrate structure. The substrate structure may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In another implementation, as depicted, the substrate structure includes a substrate 102 and an insulator layer 104. The substrate 102 may be comprised of any other suitable material(s) that those listed above and the insulator layer 104 may be a dielectric layer, such as an oxide, and may be referred to as a buried oxide (BOX) layer. The dielectric layer may be any suitable dielectric, oxide, or the like, and it may adequately electrically isolate the IC microdevices (e.g., nanowire FET(s), or the like) from the bottom substrate 102.

Figure 2:
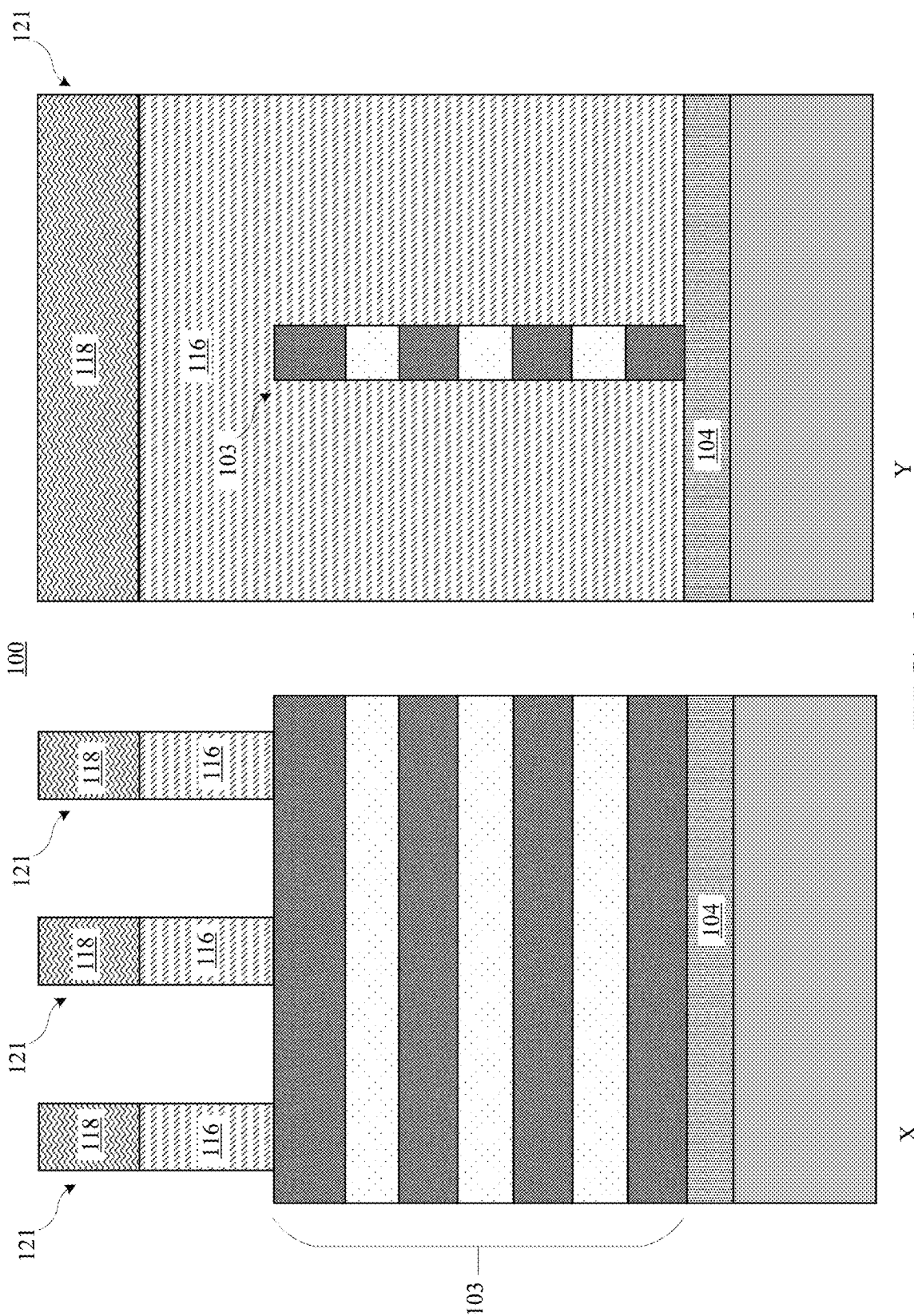

As shown in FIG. 1, after initial fabrication processing, semiconductor device 100 may include a substrate 102, an insulator layer 104, a nanowire stack 103 that includes active semiconductor layers 108 and sacrificial layers 106, a sacrificial gate 116 (shown in FIG. 2), a gate hardmask 118 (shown in FIG. 2), a gate spacer 120 (shown in FIG. 2), and inner spacers 122 (shown in FIG. 2).

The insulator layer 104 may be formed on the substrate 102. Thus, in various examples, substrate 102 is provided, insulator layer 104 is deposited over substrate 102, and then the nanowire stack 103 is formed over the insulator layer 104. Alternatively, the initial substrate may be an insulator on substrate, such as a SiGeOI (SiGe on insulator substrate), a SOI (Silicon on insulator substrate, or the like).

The nanowire stack 103 may be formed by initially forming alternating blanket sacrificial layers and blanket active semiconductor layers. In certain examples, the first one of the blanket sacrificial layers is initially formed directly on an upper surface of the insulator layer 104. In other examples, certain layers may be formed between the upper surface of the insulator layer 104 and the first one of the blanket sacrificial layers. In an example, each blanket sacrificial layer is composed of silicon-germanium (e.g., SiGe, where the Ge ranges from about 25-40%). Next, a blanket active semiconductor layer is formed on an upper surface of the first one of the blanket sacrificial layers. In an example, the blanket active semiconductor layer is composed of silicon. Several additional blanket layers of the sacrificial layer and blanket active semiconductor layer are alternately formed. In the example illustrated, there are a total of three blanket sacrificial layers and three blanket active semiconductor layers that are alternately patterned to form the nanowire stack 103. However, it should be appreciated that any suitable number of alternating layers may be formed. Although it is specifically contemplated that the blanket sacrificial layers can be formed from SiGe and that the blanket active semiconductor layers can be formed from Si, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor materials can be deposited by any appropriate mechanism. The first and second semiconductor materials (i.e., of the blanket sacrificial layers and the blanket active semiconductor layers) can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

In certain embodiments, the blanket sacrificial layers have a vertical thickness ranging, for example, from approximately 3 nm to approximately 20 nm. In certain embodiments, the blanket active semiconductor layers have a vertical thickness ranging, for example, from approximately 3 nm to approximately 10 nm. Although six total sacrificial layers and active semiconductor layers are depicted in semiconductor structure 100, it should be appreciated that the nanowire stack 103 can include any suitable number of layers. Although the range of 3-20 nm is cited as an example range of thickness, other thickness of these layers may be used. In certain examples, certain of the blanket sacrificial layers or the blanket active semiconductor layers may have different thicknesses relative to one another. Therefore, multiple epitaxial growth processes can be performed to form the alternating blanket sacrificial layers and the blanket active semiconductor layers.

In certain embodiments, it may be desirable to have a small vertical spacing (VSP) between adjacent nanowire layers in a stack of nanowires to reduce the parasitic capacitance and to improve circuit speed. For example, the VSP (the distance between the bottom surface of a first nanowire layer and the top surface of an adjacent second nanowire layer) may range from 5 nm to 15 nm. However, the VSP must be of a sufficient value to accommodate the gate that will be formed in the spaces created by later removal of respective portions of the sacrificial layers 106 formed from the blanket sacrificial layers.

In some implementations, a mask layer (not shown) is formed on the uppermost blanket active semiconductor layer. The mask layer may be comprised of any suitable material(s) known to one of skill in the art. The mask layer is patterned and used to perform the nanowire patterning process. In the nanowire patterning process, any suitable material removal process (e.g., reactive ion etching or RIE) may be used to remove portions of the various blanket layers down to the level of the insulator layer 104. Following the patterning process to the various blanket layers, one or more nanowire stacks 103 are formed. As depicted, within each nanowire stack 103 there is alternating sacrificial layers 106 and active semiconductor layers 108 formed from the associated blanket layers, respectively. Subsequently, the mask layer may be removed.

Referring now to FIG. 2, this figure depicts cross-sectional views of the semiconductor device 100 after additional fabrication operations where sacrificial gate structure 121 is formed. Sacrificial gate structure 121 may include a sacrificial gate 116 formed upon a sacrificial gate oxide layer (not shown) and a gate hardmask 118 formed upon the sacrificial gate 116.

The sacrificial gate 116 may be formed on the sacrificial gate oxide layer by any suitable deposition and/or patterning processes known to one of skill in the art. In one example, the sacrificial gate 116 is formed by depositing a thin sacrificial gate oxide (e.g., SiO$_2$, or the like) layer (not shown), followed by depositing a layer of amorphous silicon (a-Si) as the sacrificial gate 116. The sacrificial gate 116 may be composed of polycrystalline silicon (poly silicon), amorphous silicon, and/or an oxide, such as, SiO$_2$. A gate hardmask 118 is also formed on a topside of the sacrificial gate 116. The gate hardmask 118 is formed for subsequent nanowire patterning. The gate hardmask 118 can be composed of various nitride materials including, but not limited to, a nitride, an oxide, silicon nitride (SiN), and/or a combination of a nitride material and an oxide material. In certain embodiments the sacrificial gate 116 extends into and out of the page to wrap around the front and rear of the nanowire stack 103, and the subsequent removal of the sacrificial gate 116 allows an access point for later removal of the sacrificial layers 106. In certain examples, gate patterning may be performed by first patterning the gate hardmask 118 and then using the patterned gate hardmask 118 to etch the sacrificial gates 116. For clarity, the combined structure of the sacrificial gate 116 and gate hardmask 118 may be referred to herein as a sacrificial gate structure 121.

Figure 3:
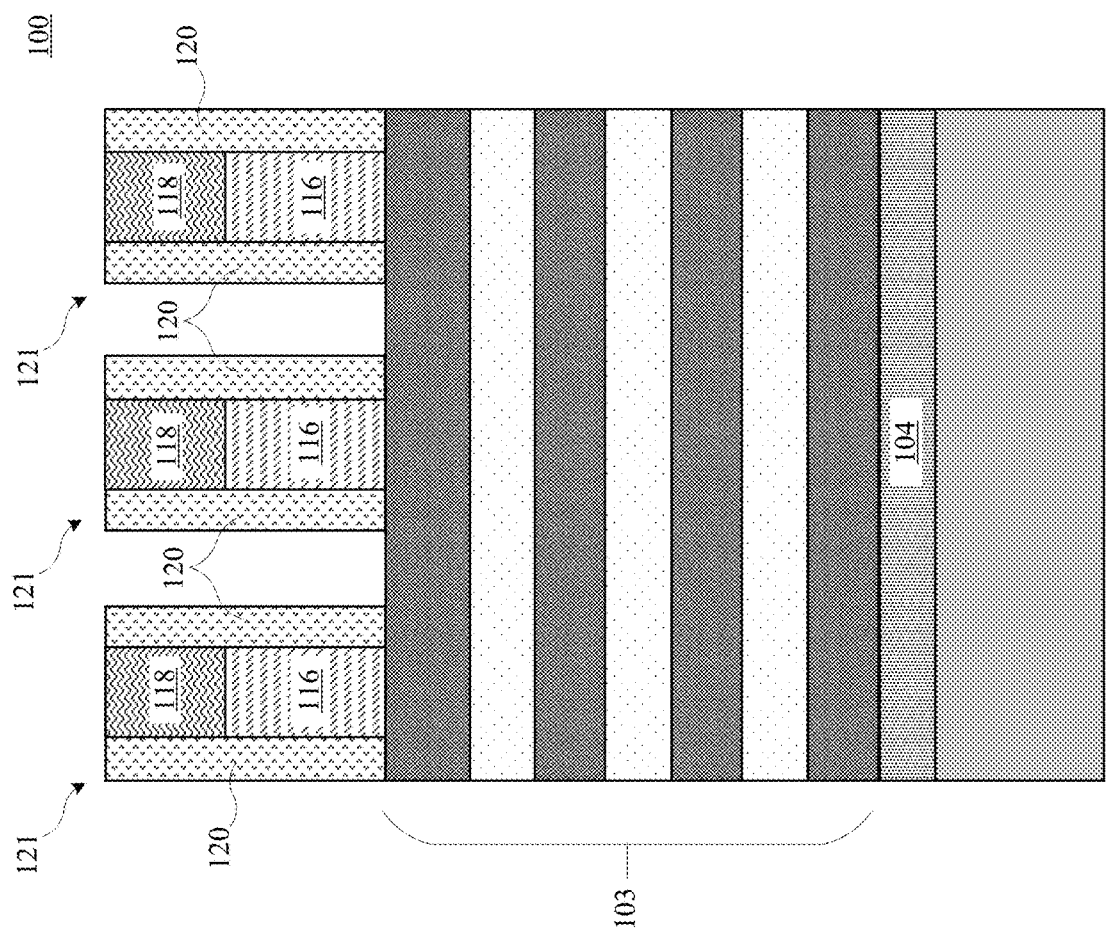

Referring now to FIG. 3, this figure depicts cross-sectional views of the semiconductor device 100 after additional fabrication operations where spacer 120 is formed upon sidewalls and front and rear surfaces of the sacrificial gate structure 121. The spacer 120 can be deposited by any suitable techniques, such as ALD, CVD, PVD, thermal oxidation, combinations thereof, or other suitable techniques. The spacer 120 material may be dielectric material, such as silicon nitride, SiBCN, SiNC, SiN, SiCO, SiNOC, or a combination thereof, or the like, and can include a single material layer or different material layers.

Figure 4:
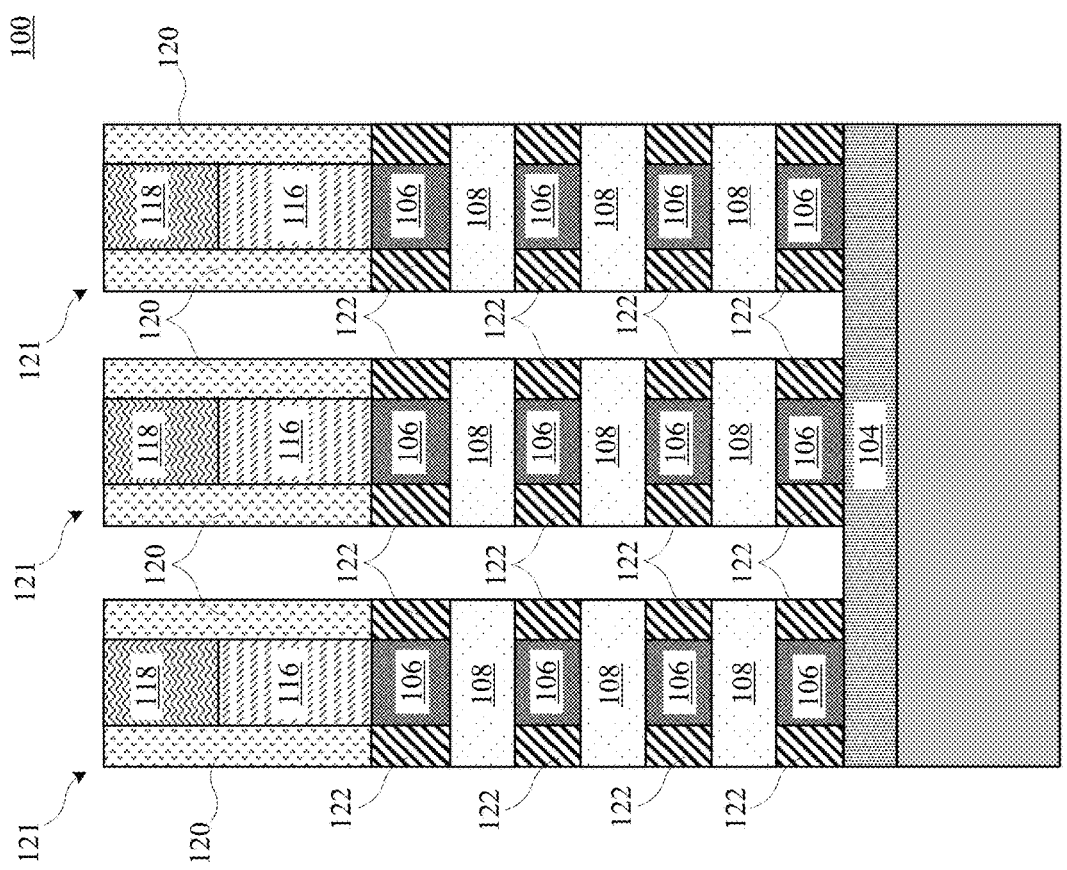

Referring now to FIG. 4, this figure depicts cross-sectional views of the semiconductor device 100 after additional fabrication operations where nanowire stack 103 is patterned by removing portions thereof that are not protected by sacrificial gate structure 121 and/or by spacer 120 and after additional fabrication operations where sacrificial layers 106 are indented.

Undesired portions of nanowire stack 103 that are not protected by sacrificial gate structure 121 and/or by spacer 120 may be etched or otherwise removed. The etch may utilize the top surface of insulator layer 104 as an etch stop. The retained one or more portions of nanowire stack 103 may be such portions thereof that were protected generally below the sacrificial gate structure 121 and/or by spacer 120.

Subsequently, the semiconductor device 100 is subjected to a directional reactive ion etch (RIE) process, which can remove portions of the sacrificial layers 106 not covered by the sacrificial gate 116 (and the sacrificial gate hardmask 118). The RIE can use a boron-based chemistry or a chlorine-based chemistry, for example, which selectively recesses the exposed portions sacrificial layers 106 (e.g., those portions of sacrificial layers 106 generally below spacer 120, etc.) without significantly removing the active semiconductor layers 108.

Subsequently, inner spacers 122 are added in the recesses that were previously formed into the sacrificial layers 106. In certain embodiments, after the formation of the inner spacers 122, an isotropic etch process is performed to create outer vertical edges to the inner spacers 122 that align with outer vertical edges of the active semiconductor layers 108. In certain embodiments, the material of the inner spacer 122 is a dielectric material such as SiN, SiO, SiBCN, SiOCN, SiCO, etc.

Figure 5:
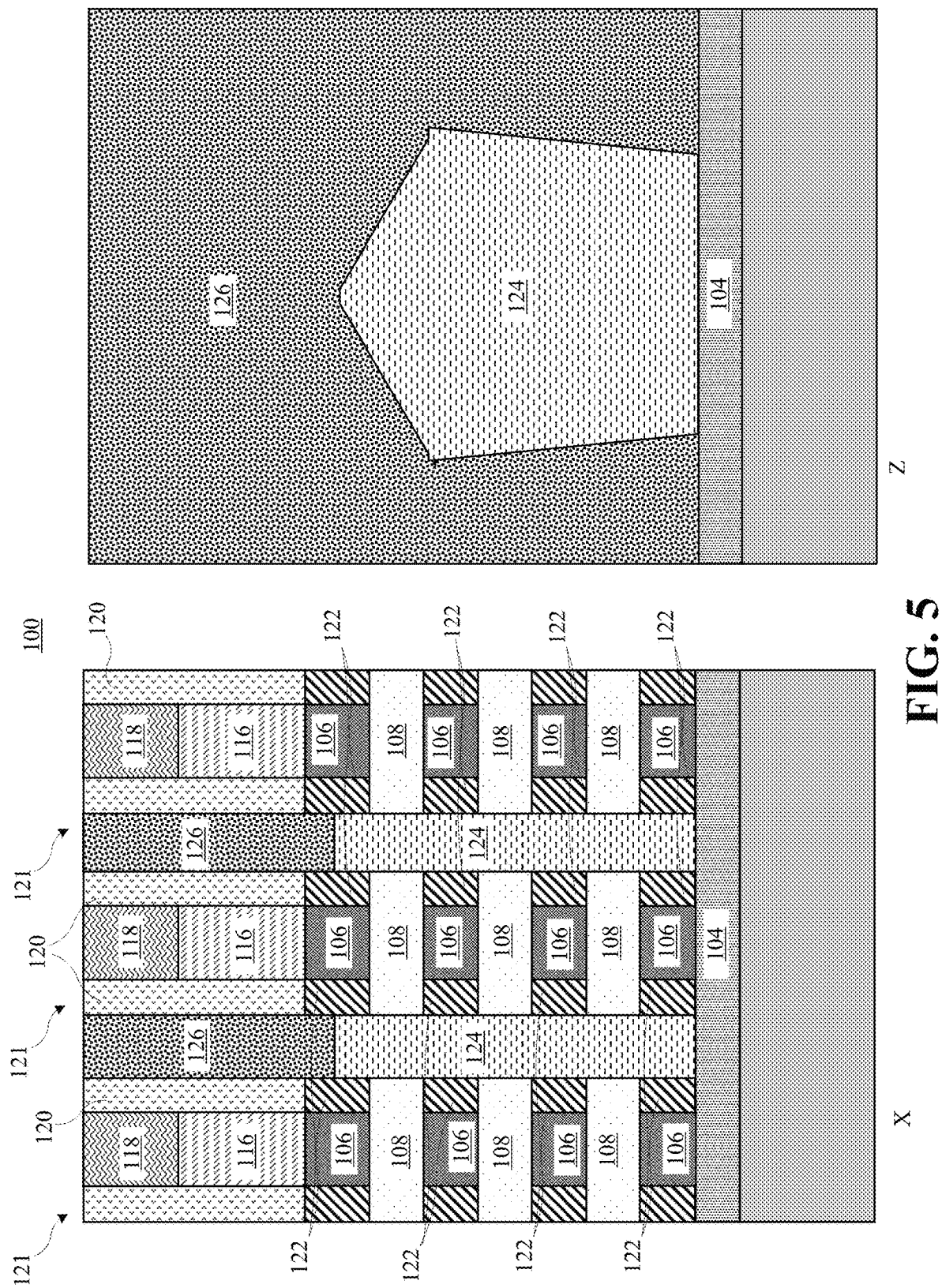

Referring now to FIG. 5, this figure depicts cross-sectional views of the semiconductor device 100 after additional fabrication operations where source/drain (S/D) region 124 is formed over the sidewalls of neighboring nanowire stacks and over the insulator layer 104 and after additional fabrication operations where interlayer dielectric (ILD) 126 is formed over the insulting layer 104 and over S/D region 124.

The S/D region 124 forms either a source or a drain, respectively, to each neighboring nanowire FET. S/D regions 124 may be epitaxially grown or formed. The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

The S/D region 124 may be formed by epitaxially growing a source/drain epitaxial region within the recess or opening between neighboring nanowire FETs. In some examples, S/D region 124 is formed by in-situ doped epitaxial growth. In some embodiments, the S/D region 124 epitaxial growth may overgrow above the upper surface of the semiconductor device 100.

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments, the S/D epitaxial growth conditions that promote in-situ Boron doped SiGe for p-type transistor and phosphorus or arsenic doped silicon or Si:C for n-type transistors. The doping concentration in the S/D region 124 can be in the range of $1\times10^{19}$ $cm^{-3}$ to $2\times10^{21}$ $cm^{-3}$, or preferably between $2\times10^{20}$ $cm^{-3}$ to $7\times10^{20}$ $cm^{-3}$.

In certain implementations, the S/D region 124 may be partially recessed such that an upper portion of the S/D region 124 are removed. For example, the upper portion of the one or more S/D regions 124 may be etched or otherwise removed. The etch may be timed or otherwise controlled to stop the removal of S/D region 124 such that the top surface of S/D region 124 is above the upper surface of the topmost active semiconductor layer 108.

Subsequently, the ILD 126 may be formed around the S/D region 124 and upon insulator layer 104. The ILD 126 may be formed by depositing a dielectric material upon S/D region 124 and upon insulator layer 104. The ILD 126 can be any suitable material, such as, for example, porous silicates, carbon doped oxides, silicon dioxides, silicon nitrides, silicon oxynitrides, or other dielectric materials. Any known manner of forming the ILD 126 can be utilized. The ILD 126 can be formed using, for example, CVD, PECVD, ALD, flowable CVD, spin-on dielectrics, or PVD.

In an example, the ILD 126 may be formed to a thickness above the top surface of the semiconductor device 100 and subsequently etched back such that the top surface of the ILD 126 is coplanar with a top surface of the gate hardmask 118 and/or a top surface of spacer(s) 120. In another example, a planarization process, such as a CMP, may be performed to create a planar surface for the semiconductor device 100.

Figure 6:
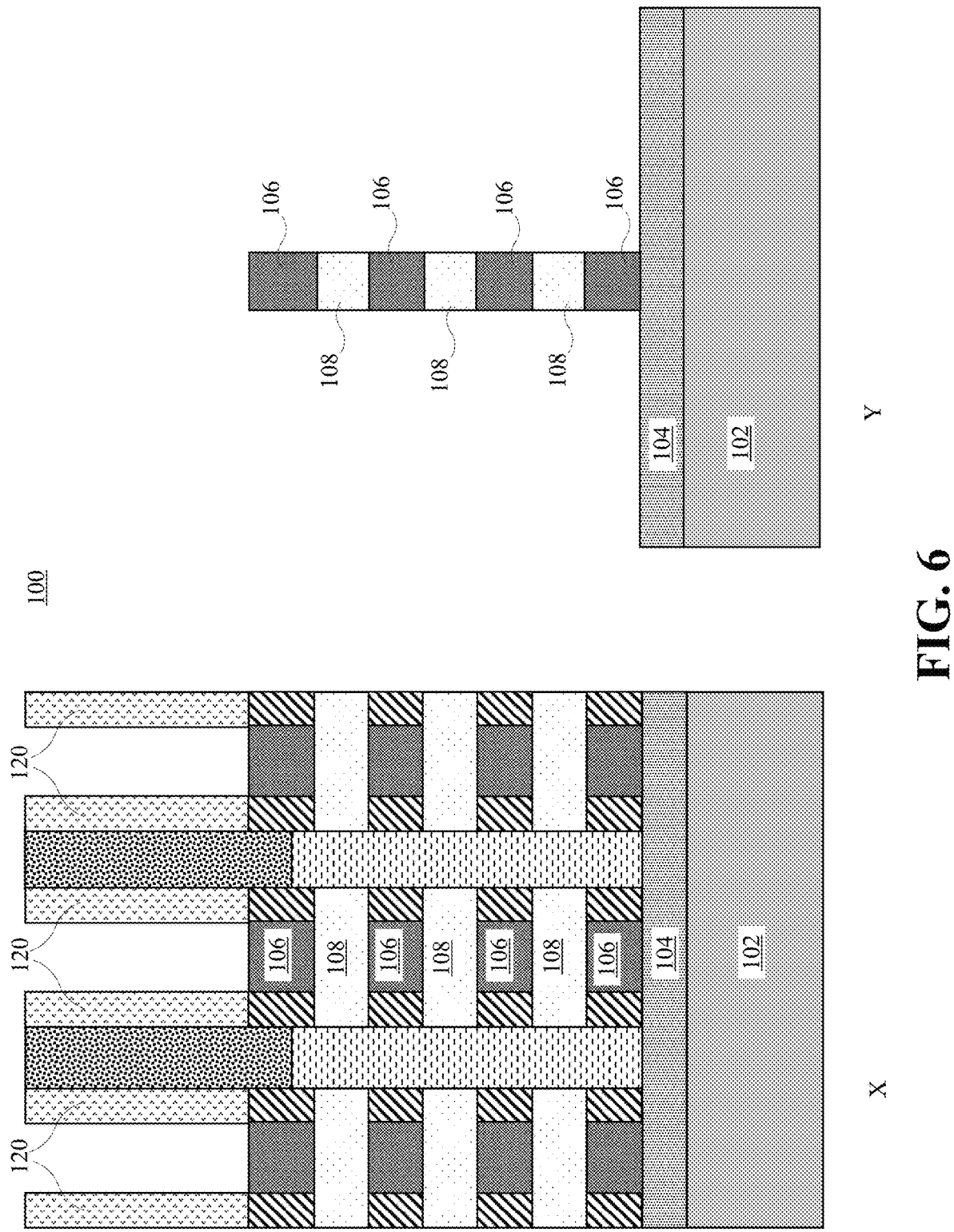

Referring now to FIG. 6, this figure depicts cross-sectional views of the semiconductor device 100 after additional fabrication operations where sacrificial gate structure 121 (shown in FIG. 5) is removed. Sacrificial gate structure 121 may be removed by initially removing gate hardmask 118 by a planarization process, such as a CMP, that results in a planar upper surface for the semiconductor device 100. For example, after the planarization process, the top surfaces of spacers 120, the top surfaces of sacrificial gates 116, and the top surface of ILD 126 may be coplanar. Subsequently, the sacrificial gate 116 and sacrificial gate oxide may be removed by a removal technique, such as an etch.

Alternatively, as depicted, sacrificial gate structure 121 may be removed by removing gate hardmask 118, sacrificial gate 116 and sacrificial gate oxide by a removal technique, such as one or more series of etches. For example, such removal may be accomplished by an etching process which may include a dry etching process such as RIE, plasma etching, ion etching or laser ablation. The etching can further include a wet chemical etching process in which one or more chemical etchants are used to remove the hardmask 118, sacrificial gate 116 and sacrificial gate oxide.

Figure 7:
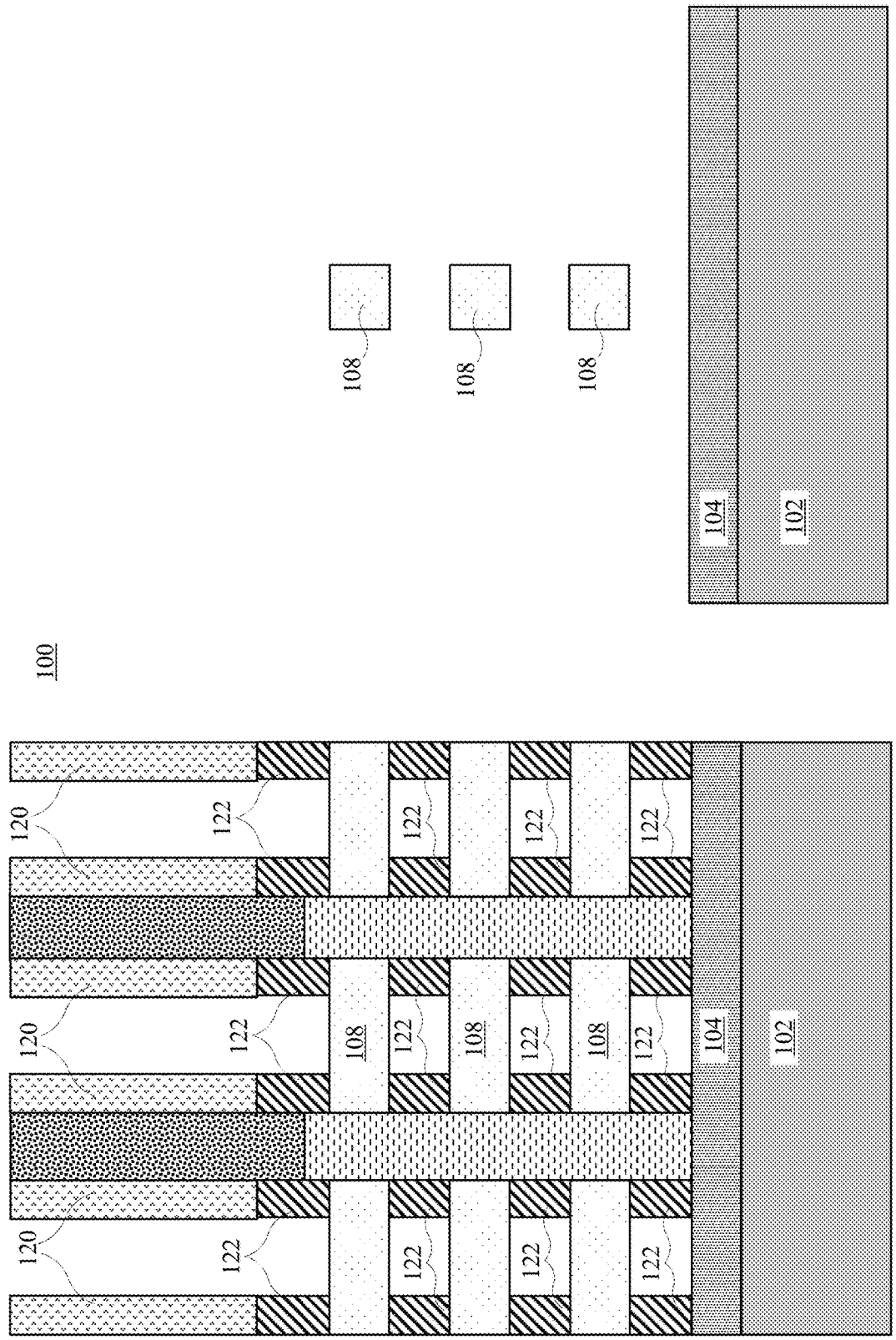

Referring now to FIG. 7, this figure depicts cross-sectional views of the semiconductor device 100 after additional fabrication operations where sacrificial layers 106 (shown in FIG. 6) are removed, released, or the like. Subsequent thereto, there are void spaces between the active semiconductor layers 108 due to the removal of the sacrificial layers 106. It should be appreciated that during the removal of the sacrificial gate 116, the sacrificial oxide layer, and the sacrificial layers 106, etc. appropriate etchants are used that do not significantly remove material of active semiconductor layers 108, insulator layer 104, inner spacers 122, etc. The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

Figure 8:
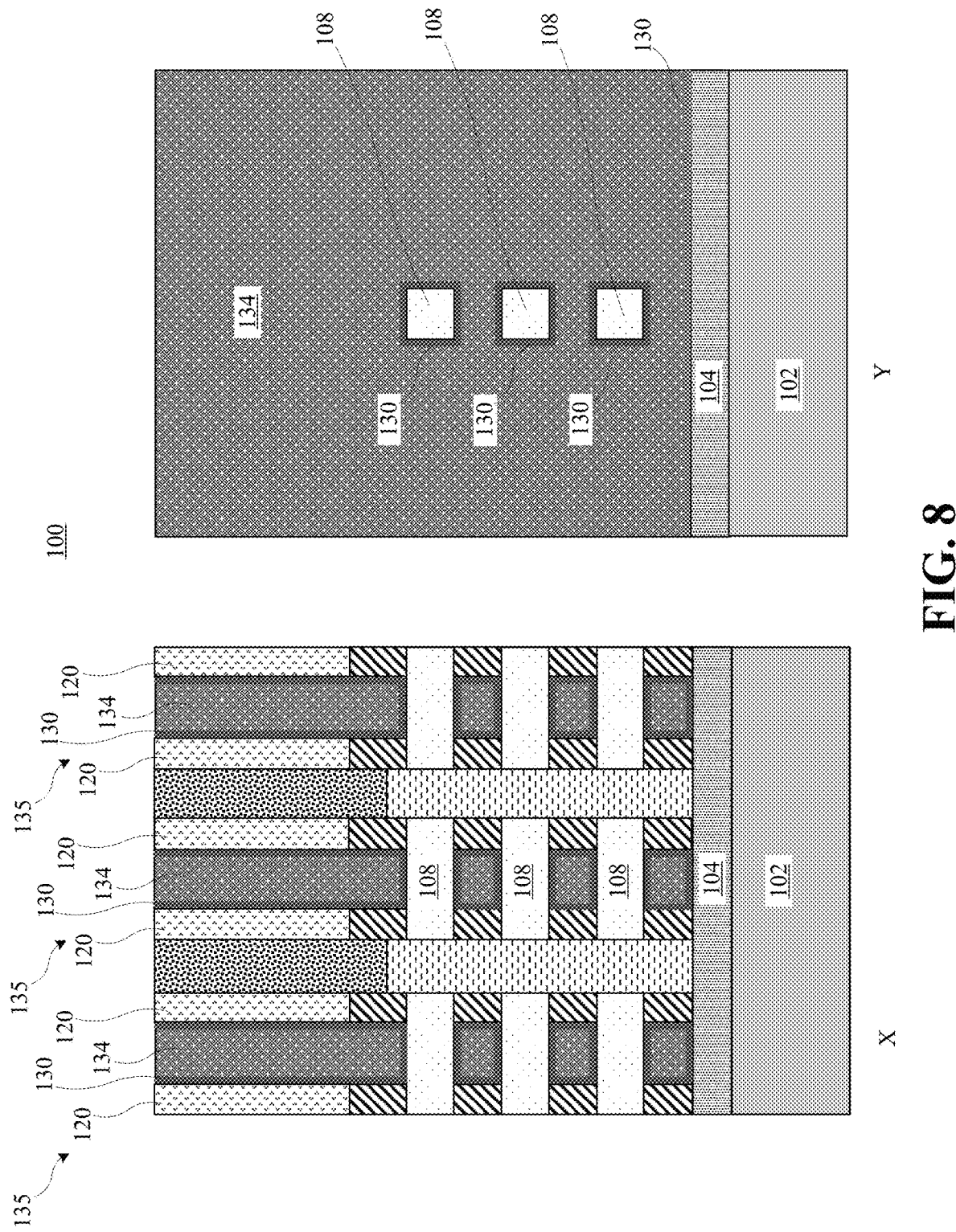

Referring now to FIG. 8, this figure depicts cross-sectional views of the semiconductor device 100 after additional fabrication operations where replacement gate structure 135 is formed in place of the sacrificial gate structure 121 around one or more of the active semiconductor layers 108.

Replacement gate structure 135 may be formed by initially forming an interfacial layer (not shown) on the interior surfaces of the spacer 120 and the interior surfaces of the active semiconductor layers 108, the inner spacers 122, etc. Then, a high-κ layer 130 is formed to cover the surfaces of exposed surfaces of the interfacial layer. The high-κ layer 130 can be deposited by any suitable techniques, such as ALD, CVD, metal-organic CVD (MOCVD), physical vapor deposition (PVD), thermal oxidation, combinations thereof, or other suitable techniques. A high-lc dielectric material is a material with a higher dielectric constant than that of $SiO_2$, and can include e.g., LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HMO, HfTiO, (Ba,Sr)$TiO_3$(BST), $Al_2O_3$, $Si_3N_4$, oxynitrides (SiON), or other suitable materials. The high-κ layer 130 can include a single layer or multiple layers, such as metal layer, liner layer, wetting layer, and adhesion layer. In other embodiments, the high-κ layer 130 can include, e.g., Ti, Ag, Al, TiAlN, TaC, TaCN, TaSiN, Mn, Zr, TiN, TaN, Ru, Mo, Al, WN, Cu, W, or any suitable materials.

Replacement gate structure 135 may be further formed by depositing a work function metal (WFM) gate 134 (or replacement gate) upon the high-κ layer 130. The WFM gate 134 can be comprised of metals, such as, e.g., copper (Cu), cobalt (Co), aluminum (Al), platinum (Pt), gold (Au), tungsten (W), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, the height of the WFM gate 134 can be reduced by chemical-mechanical polishing (CMP) and/or etching. Therefore, the planarization process can be provided by CMP. Other planarization process can include grinding and polishing. In general, the work function metal (WFM) gate 134 sets the threshold voltage (Vt) of the device. The high-K layer 130 separates the WFM gate 134 from the nanowire channel (i.e., active semiconductor layers 108). Other metals that may be desired to further fine tune the effective work function (eWF) and/or to achieve a desired resistance value associated with current flow through the gate in the direction parallel to the plane of the nanowire channel.

Figure 9:
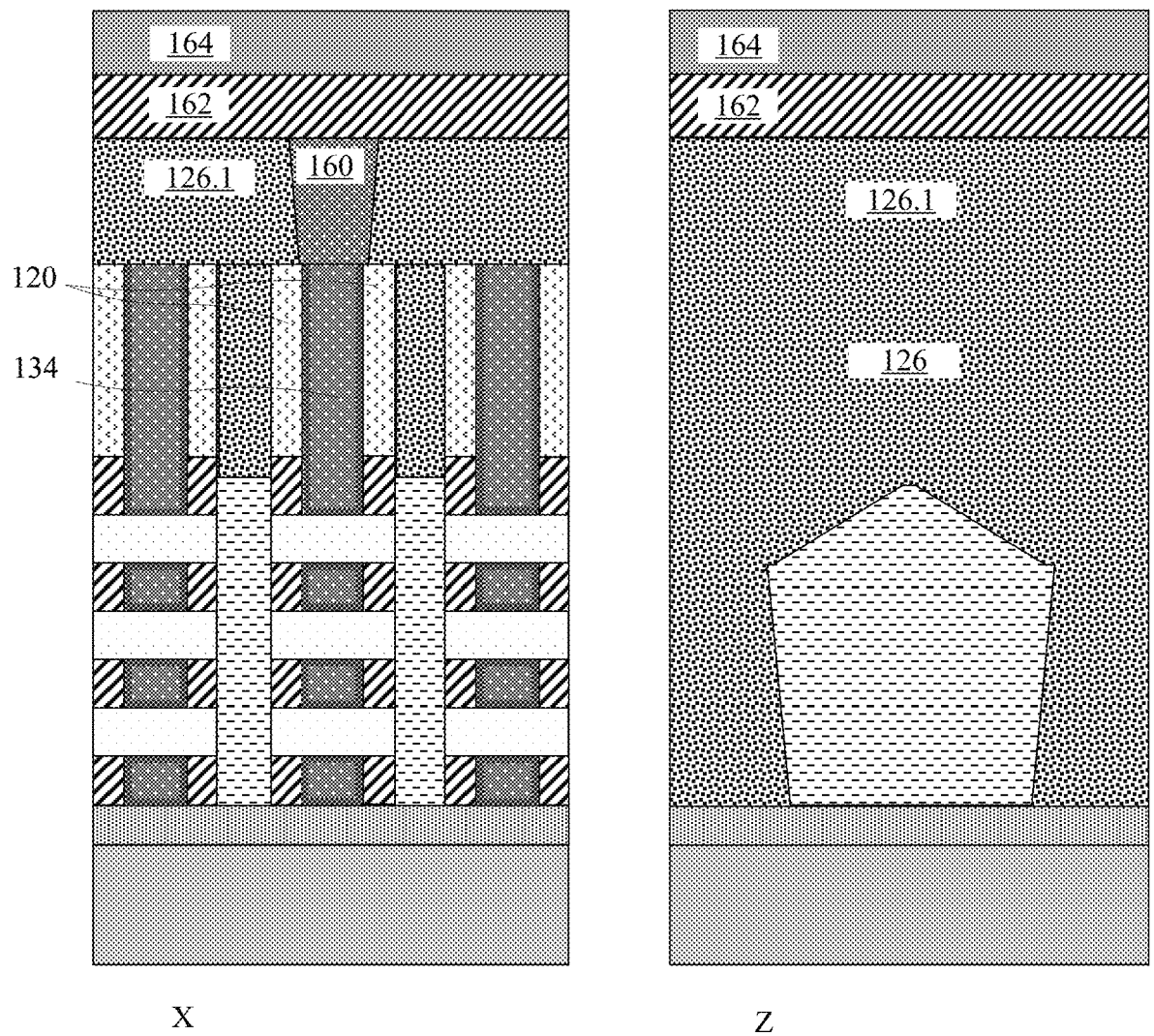

Referring now to FIG. 9, this figure is a cross-sectional view of semiconductor device 100 after additional fabrication operations, where ILD 126.1 is formed (e.g., ILD 126 is thickened, etc.), gate contact 160 may be formed, BEOL structure(s) 162 are formed, and a carrier wafer 164 is attached.

The ILD 126.1 may be formed upon the top surface of ILD 126 and the other top surfaces of the semiconductor device 100, as depicted in FIG. 8. The ILD 126.1 may be formed by depositing a dielectric material, such as, for example, porous silicates, carbon doped oxides, silicon dioxides, silicon nitrides, silicon oxynitrides, or other dielectric materials. Any known manner of forming the ILD 126.1 can be utilized. The ILD 126.1 can be formed using, for example, CVD, PECVD, ALD, flowable CVD, spin-on dielectrics, or PVD.

Subsequently, gate contact 160 is formed by forming a gate contact trench within ILD 126.1 and depositing conductive material within the gate contact trench over a first replacement gate structure 135. Gate contact 160 may consist of a silicide liner, such as Ni, NiPt or Ti, etc., a metal adhesion liner, such as TiN, TaN, etc., and a conductive metal fill, such as Al, Ru, W, Co, Cu, etc. The formation of gate contact 160 may include etching the ILD 126.1 to form via openings, deposition of material(s), and performing a planarization process, such as a CMP process or a mechanical grinding process, to remove excess portions of the conductive barrier layer and the conductive material. Subsequently, the top surface of gate contact 160 and the top surface of ILD 126.1 may be coplanar. Gate contact 160 may be formed during middle of the line (MOL) processes.

BEOL structure(s) 162 include metallization levels, associated metallization dielectric layers, VIAs that connect the metallization feature(s) within the metallization levels with an underlying device or structure, and/or conductive bonding pads, or the like. BEOL structure(s) 162 include a signal line or wiring line, such as a conductive wire, conductive trace, or the like, that is formed over gate contact 160 making electrical contact therewith. A signal line is defined herein as a conductive wiring feature that is configured to electrically carry a functional or logical potential or signal that is to change or is otherwise dynamic over time. In some examples, there may be 5 metal levels $M_0$-$M_4$ within BEOL structure(s) 162. In some examples, there may be more than 10 metal levels $M_0$-$M_x$ within BEOL structure(s) 162. In some examples, gate contact 160 may contact and connect the replacement gate structure 135 of the first FET to a trace, power plane, or the like located within the lowest metal level $M_0$.

Upon completion of BEOL structure(s) 162, carrier wafer 164 may be bonded or otherwise attached to the top surface of BEOL structure(s) 162, as depicted. Carrier wafer 164 may be attached to semiconductor device 100 by any carrier bonding technique.

Figure 10:
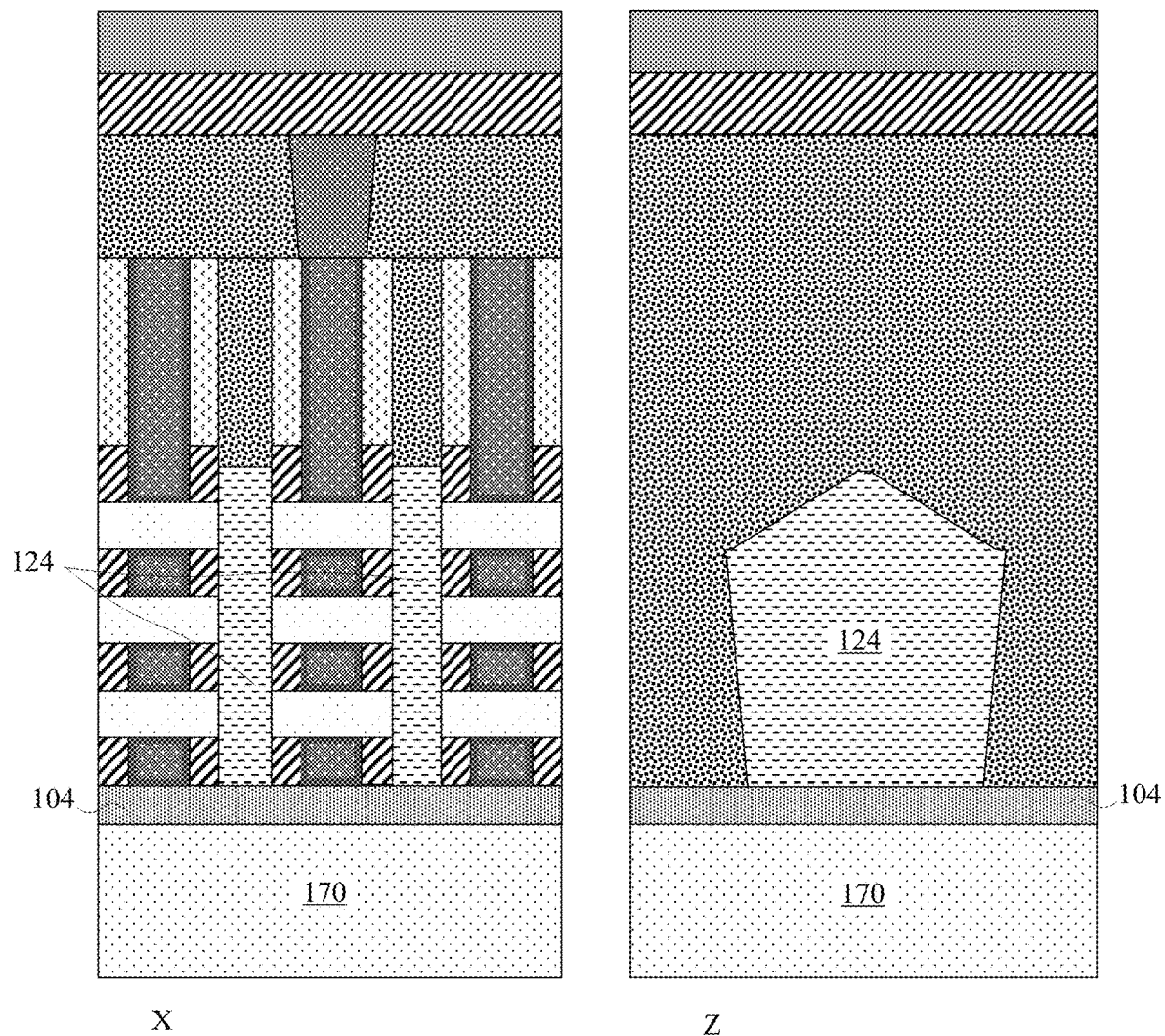

Referring now to FIG. 10, this figure is a cross-sectional view of semiconductor device 100 after additional fabrication operations where semiconductor device 100 may be flipped for backside processing, substrate 102 is removed, and ILD 170 is formed. The substrate 102 may be removed by any removal technique, such as a combination of wafer grinding, CMP, dry and wet etch. Removal of substrate 102 exposes the bottom surface of insulator layer 104.

The ILD 170 may be formed by depositing a dielectric material, upon insulator layer 104. The ILD 170 can be any suitable material, such as, for example, porous silicates, carbon doped oxides, silicon dioxides, silicon nitrides, silicon oxynitrides, or other dielectric materials. Any known manner of forming the ILD 170 can be utilized. The ILD 170 can be formed using, for example, CVD, PECVD, ALD, flowable CVD, spin-on dielectrics, or PVD.

Figure 11:
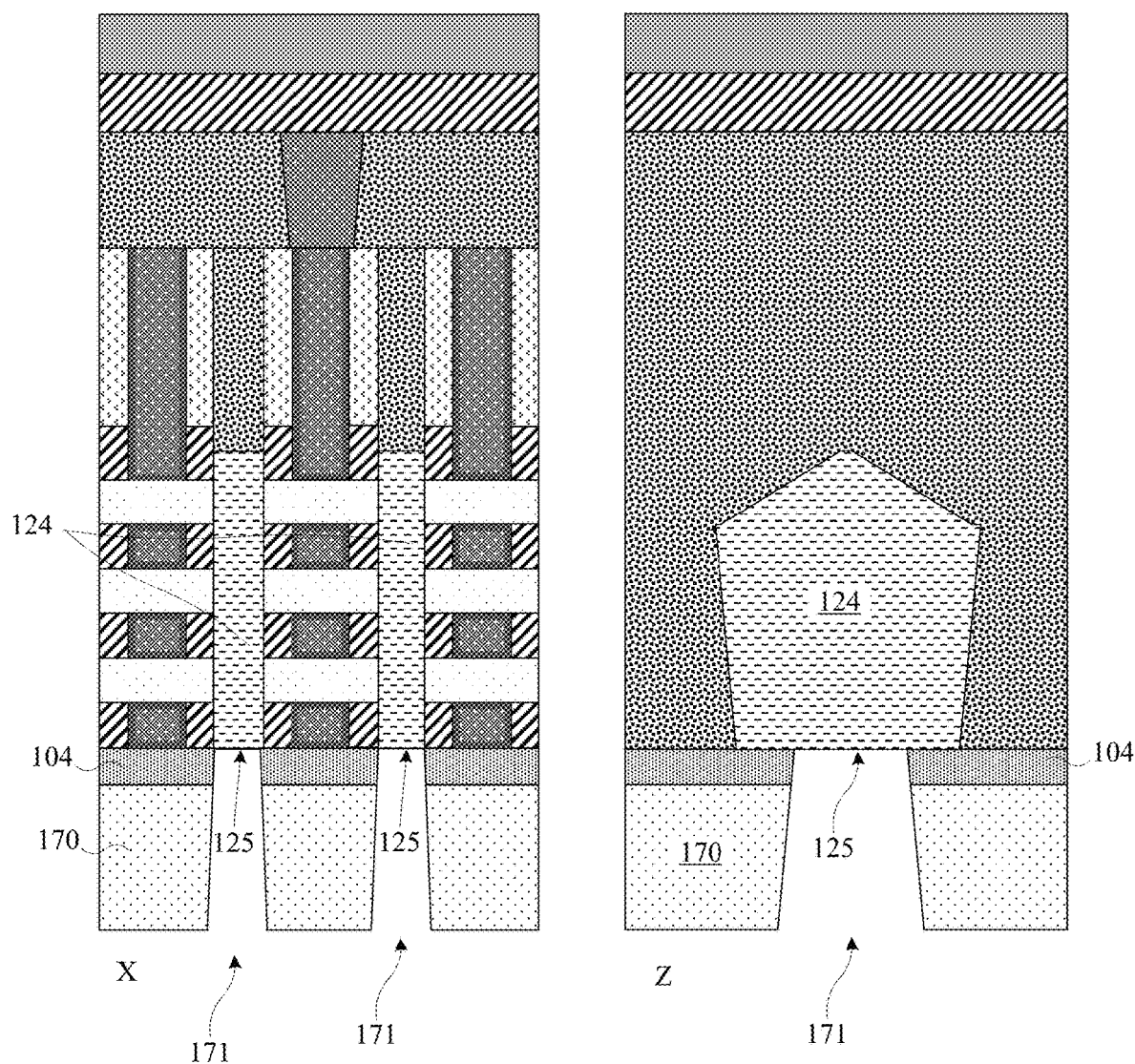

Referring now to FIG. 11, this figure are cross-sectional views of semiconductor device 100 after additional fabrication operations, where S/D contact trenches 171 are formed. The S/D contact trenches 171 are formed from the backside of semiconductor device through ILD 170 and through insulator layer 104 and may expose a portion of the bottom surface 125 of respective S/D regions 124. In some examples, S/D regions 124 may be an etch stop in the formation of the S/D contact trenches 171.

Figure 12:
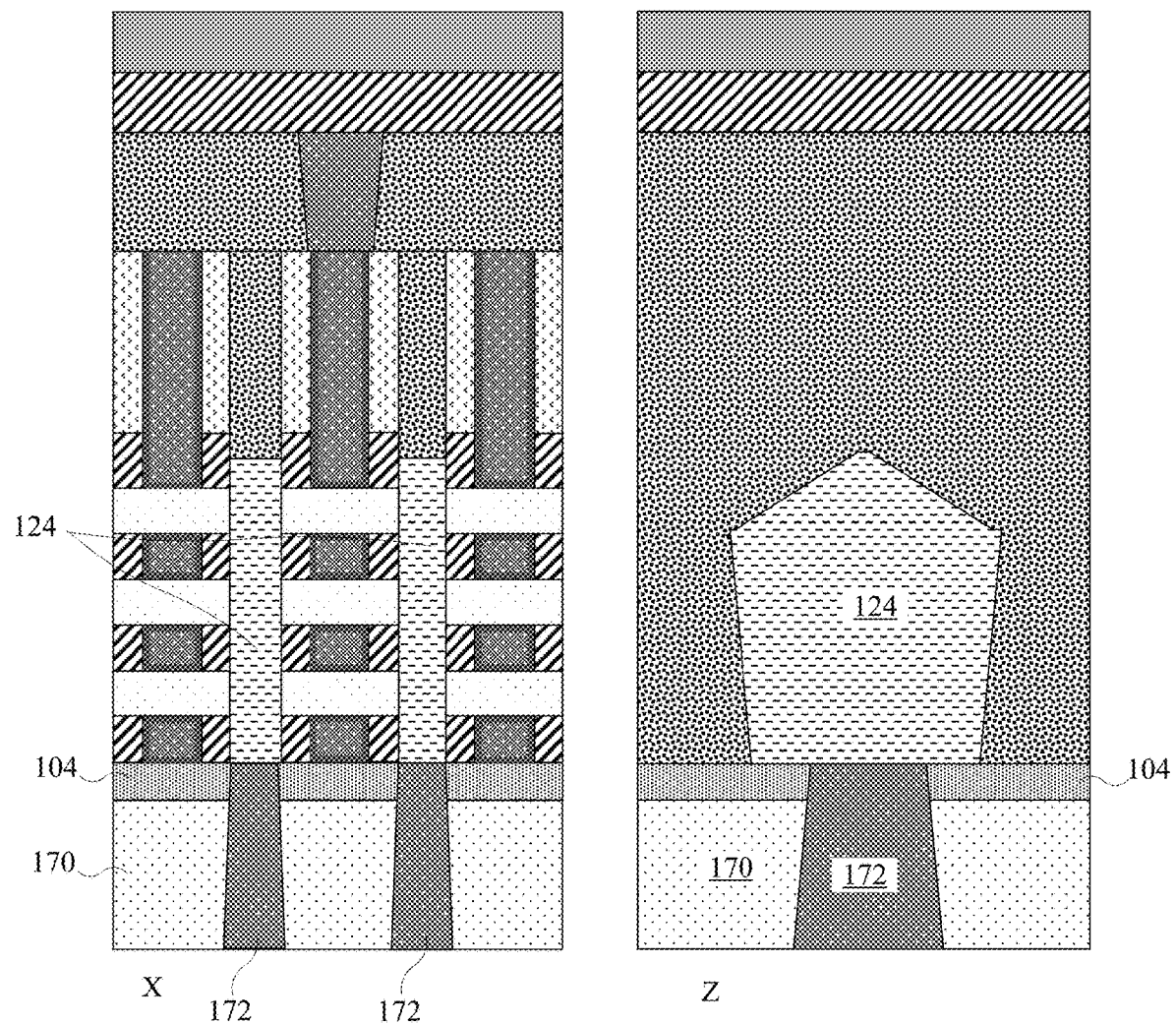

Referring now to FIG. 12, this figure is cross-sectional views of semiconductor device 100 after additional fabrication operations, where S/D contacts 172 are formed. Each S/D contact 172 may directly contact at least the exposed bottom surface of a respective single S/D region 124. The backside S/D contact 172 may consist of a silicide liner, such as Ni, NiPt or Ti, etc., a metal adhesion liner, such as TiN, TaN, etc., and a conductive metal fill, such as Al, Ru, W, Co, Cu, etc. In some examples, S/D contact 172 may be a contact feature, such as a vertical interconnect access (VIA) to a backside power rail 180 or a backside ground rail 181, respectively shown in FIG. 13, such as a backside wiring line, backside power plane, or the like. The formation of the backside S/D contact 172 may include etching the ILD 170 and insulator layer 104 to form via openings, forming a blanket conductive barrier layer extending into the via openings, depositing a metallic or conductive material over the blanket conductive barrier layer, and performing a planarization process, such as a CMP process or a mechanical grinding process, to remove excess portions of the conductive barrier layer and the conductive material. Subsequently, the bottom surface of S/D contact 172 and the bottom surface of ILD 170 may be coplanar.

Figure 13:
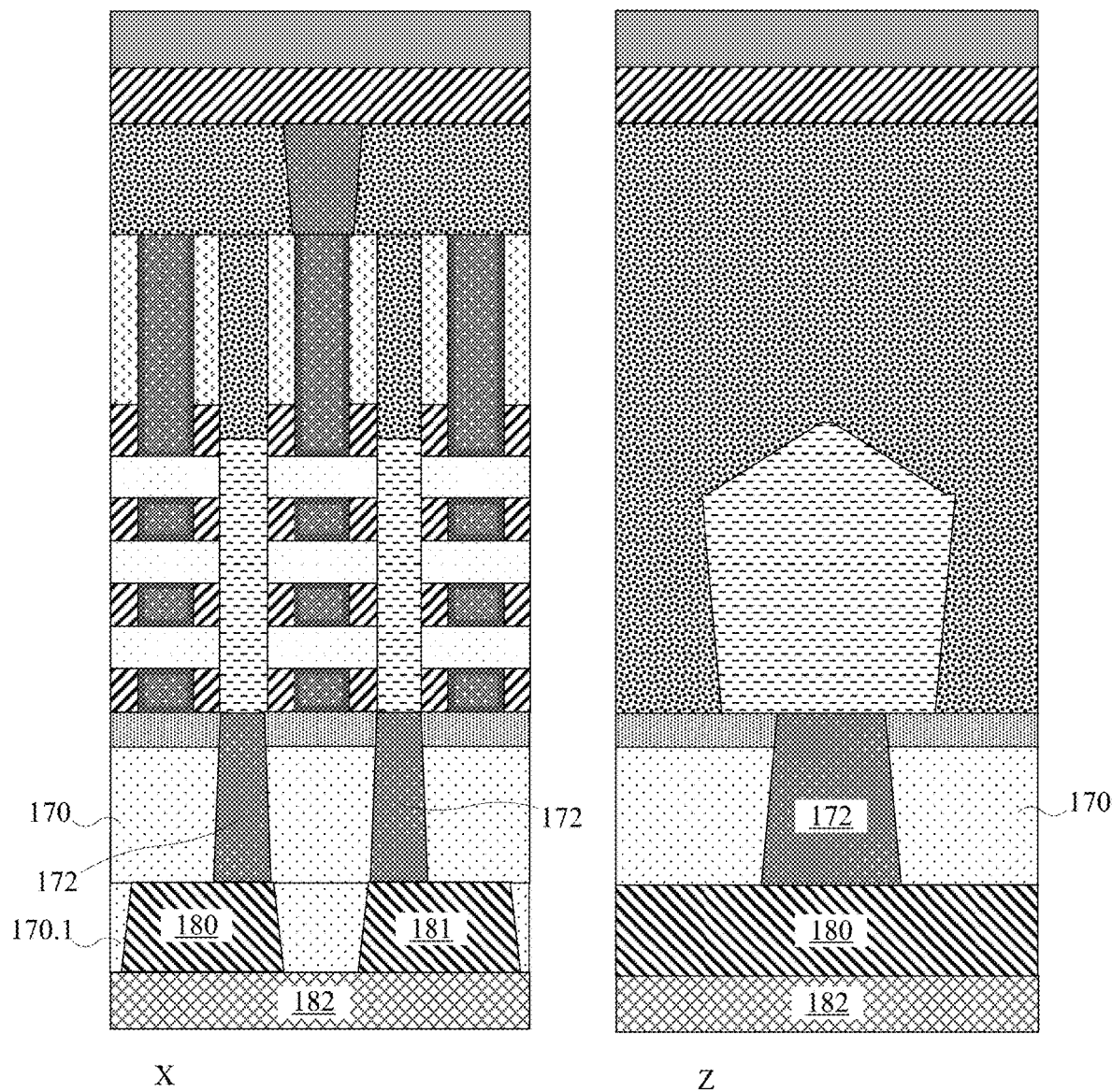

Referring now to FIG. 13, this figure is a cross-sectional view of semiconductor device 100 after additional fabrication operations, where ILD 170.1 is formed (e.g., ILD 170 thickened, etc.), backside power rail 180 and backside ground rail 181 are formed, and backside power distribution network (BSPDN) 182 is formed.

The ILD 170.1 may be formed upon the bottom surface of ILD 170 and the other bottom surfaces of the semiconductor device 100, as depicted in FIG. 12. The ILD 170.1 may be formed by depositing a dielectric material, such as, for example, porous silicates, carbon doped oxides, silicon dioxides, silicon nitrides, silicon oxynitrides, or other dielectric materials. Any known manner of forming the ILD 170.1 can be utilized. The ILD 170.1 can be formed using, for example, CVD, PECVD, ALD, flowable CVD, spin-on dielectrics, or PVD.

Subsequently, backside power rail 180 and backside ground rail 181 are formed by forming a respective backside rail trench within ILD 170.1 and depositing conductive material within the backside rail trench over a respective S/D contact 172. The backside rail trench may expose the entire bottom surface of the respective S/D contact 172. Backside power rail 180 and backside ground rail 181 may directly contact at least the exposed bottom surface of the respected S/D contact 172.

Backside power rail 180 and backside ground rail 181 may consist of a metal, such as copper, aluminum, tungsten, cobalt, metal alloys thereof, or the like. In some examples, backside power rail 180 may be a power plane (e.g., VDD power plane, etc.) and backside ground rail 181 may be a ground plane (VSS power plane, etc.). Backside power rail 180 and backside ground rail 181 may include a conductive region and a conductive barrier layer(s) between the sidewalls and upper surfaces of the conductive regions and the ILD 170.1 and/or ILD 170. The conductive barrier layer(s) may be formed of titanium, titanium nitride, tantalum, tantalum nitride, cobalt, a combination thereof, or the like. The conductive regions may be formed of metals such as copper, aluminum, tungsten, cobalt, alloys thereof, or the like. The formation of backside power rail 180 and backside ground rail 181 may include etching the ILD 170.1 to form a power plane opening, forming a blanket conductive barrier layer extending into the power plane opening, depositing a metallic or conductive material over the blanket conductive barrier layer, and performing a planarization process, such as a CMP process or a mechanical grinding process, to remove excess portions of the conductive barrier layer and the conductive material. Subsequently, the bottom surface of backside power rail 180 and the bottom surface of backside ground rail 181 and the bottom surface of ILD 170 may be coplanar. BSPDN 182 includes known power distribution network features and/or structures to adequately provide VDD potential to backside power rail 180 and to adequately provide VSS potential to backside ground rail 181. A backside power rail is defined herein as a conductive wiring feature that is configured to electrically carry power potential that is to not change or is otherwise static over time. A backside ground rail is defined herein as a conductive wiring feature that is configured to electrically carry ground potential that is to not change or is otherwise static over time.

For clarity, as depicted, semiconductor device 100 may include a FET with a first replacement gate structure 135 and associated gate contact 160 upon a top surface of the first replacement gate structure 135. The gate contact 160 is electrically connected to a BEOL wiring feature generally above the FET. The FET may further include a first S/D region 124 (e.g., a FET source) and associated backside S/D contact 172 upon a bottom surface of the first S/D region 124. The S/D contact 172 is electrically connected to a backside power rail 180 generally below the FET. The FET may further include a second S/D region 124 (e.g., a FET drain) and associated backside S/D contact 172 upon a bottom surface of the second S/D region 124. The S/D contact 172 is electrically connected to a backside ground rail 181 generally below the FET.

Figure 14:
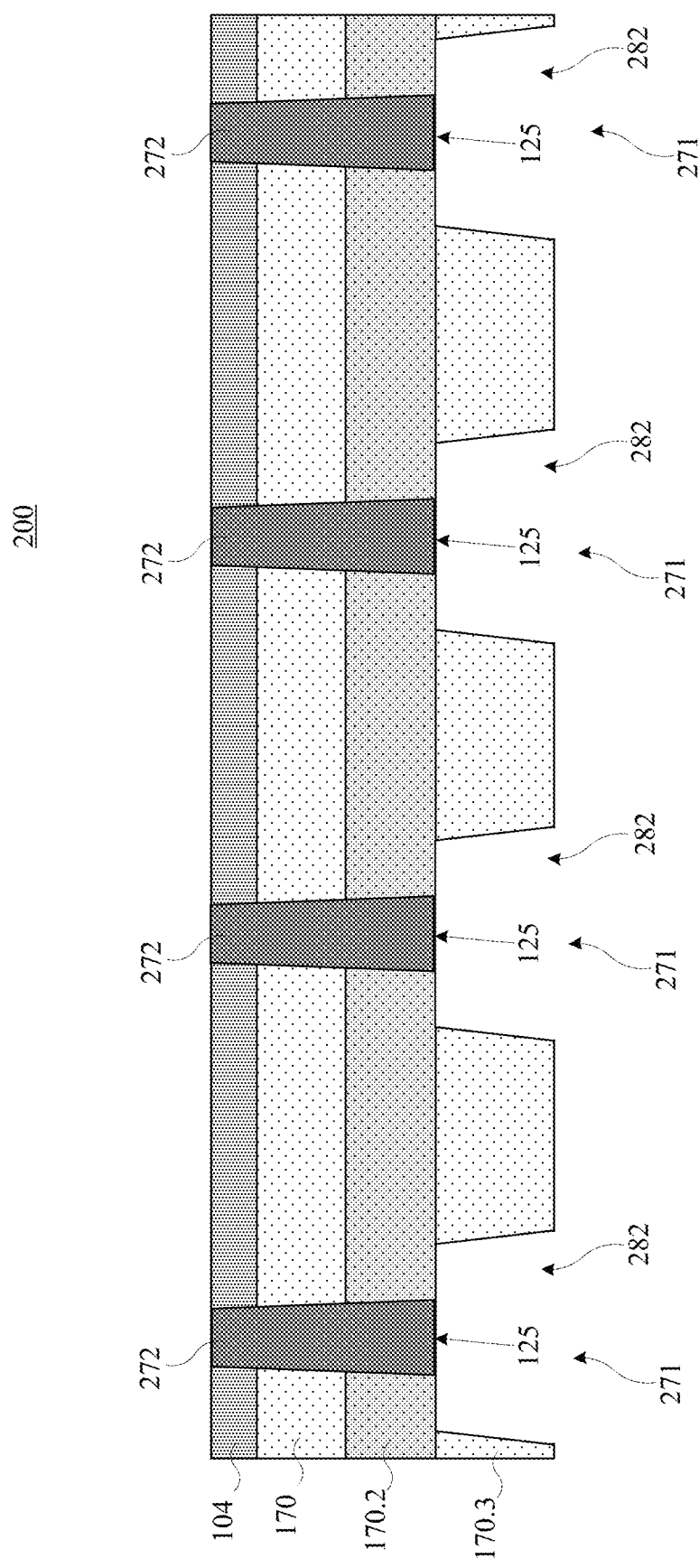
FIG. 14 through FIG. 26 depict various fabrication structure views of exemplary semiconductor devices that are fabricated to include a backside power rail, a backside ground rail, and a backside isolation rail, according to embodiments.

Referring now to FIG. 14, this figure depicts a cross-sectional view of a semiconductor device 200 at an intermediate stage of the fabrication process, according to embodiments. For clarity, semiconductor device 200 may have similar structural features relative to semiconductor device 100. For example, semiconductor device 200 may have insulator layer 104, one or more IC microdevice, such as FETs, diodes, gates, storage cells, or the like, (not shown) formed upon insulator layer 104. The one or more IC microdevice(s) may have an electrical node that is connected to a frontside contact, similar to gate contact 160, and to a BEOL wiring feature. Further, the one or more IC microdevice(s) may have an electrical node that is connected to a backside contact 272 and to backside power rail 180 or to a backside ground rail 181, respectively.

In an exemplary fabrication operation, where semiconductor device 200 may be flipped for backside processing, substrate 102 is removed, and ILD 170 is formed. The substrate 102 may be removed by any removal technique, such as a combination of wafer grinding, CMP, dry and wet etch. Removal of substrate 102 exposes the bottom surface of insulator layer 104.

The ILD 170 may be formed by depositing a dielectric material, upon insulator layer 104. The ILD 170 can be any suitable material, such as, for example, porous silicates, carbon doped oxides, silicon dioxides, silicon nitrides, silicon oxynitrides, or other dielectric materials. Any known manner of forming the ILD 170 can be utilized. The ILD 170 can be formed using, for example, CVD, PECVD, ALD, flowable CVD, spin-on dielectrics, or PVD.

In the depicted example, another etch selective ILD 170.2 may be formed by depositing a dielectric material that has etch selectivity to ILD 170, upon ILD 170. The ILD 170.2 can be any suitable material, such as, for example, porous silicates, carbon doped oxides, silicon dioxides, silicon nitrides, silicon oxynitrides, or other dielectric materials with etch selectivity to ILD 170. Any known manner of forming the ILD 170.2 can be utilized. The ILD 170.2 can be formed using, for example, CVD, PECVD, ALD, flowable CVD, spin-on dielectrics, or PVD.

Subsequently, backside contact trenches 271 are formed. The backside contact trenches 271 are formed from the backside of semiconductor device through ILD 170.2, through ILD 170, and through insulator layer 104 and may expose a portion of the bottom surface of an associated electrical node of the IC microdevice there above. In some examples, this electrical node of the IC microdevice there above may be an etch stop in the formation of respective backside contact trenches 271.

Subsequently, a backside contact 272 is formed within each backside contact trench 271. Each backside contact 272 may directly contact at least the exposed electrical node of the associated IC microdevice(s) there above. The backside contact 272 may consist of a silicide liner, such as Ni, NiPt or Ti, etc., a metal adhesion liner, such as TiN, TaN, etc., and a conductive metal fill, such as Al, Ru, W, Co, Cu, etc. In some examples, backside contact 272 may be a contact feature, such as a vertical interconnect access (VIA) to a backside power rail 180 or a backside ground rail 181, respectively shown in FIG. 15, such as a backside wiring line, backside power plane, or the like. The formation of the backside contact 272 may include etching ILD 170.2, etching ILD 170, and etching insulator layer 104 to form via openings, forming a blanket conductive barrier layer extending into the via openings, depositing a metallic or conductive material over the blanket conductive barrier layer, and performing a planarization process, such as a CMP process or a mechanical grinding process, to remove excess portions of the conductive barrier layer and the conductive material. Subsequently, the bottom surface of backside contact 272 and the bottom surface of ILD 170.2 may be coplanar.

Subsequently, ILD 170.3 is formed upon the bottom surface of ILD 170.2 and the respective bottom surface of backside contacts 272. The ILD 170.3 may be formed by depositing a dielectric material, such as, for example, porous silicates, carbon doped oxides, silicon dioxides, silicon nitrides, silicon oxynitrides, or other dielectric materials. As depicted, the ILD 170.3 may be the same material relative to the ILD 170. Any known manner of forming the ILD 170.3 can be utilized. The ILD 170.3 can be formed using, for example, CVD, PECVD, ALD, flowable CVD, spin-on dielectrics, or PVD.

Subsequently, one or more backside rail trenches 282 are formed within ILD 170.3. One backside rail trench 282 may expose the entire bottom surface 125 of a respective backside contact 272. A mask layer (not shown) may be formed on the bottom surface of ILD 170.3. The mask layer may be comprised of any suitable material(s) known to one of skill in the art. The mask layer is patterned to create openings therein at locations generally below backside contacts 272. Through the openings in the mask, such unprotected portions of ILD 170.3 may be etched away or otherwise removed (e.g., reactive ion etching or RIE) to the level of the ILD 170.2.

Figure 15:
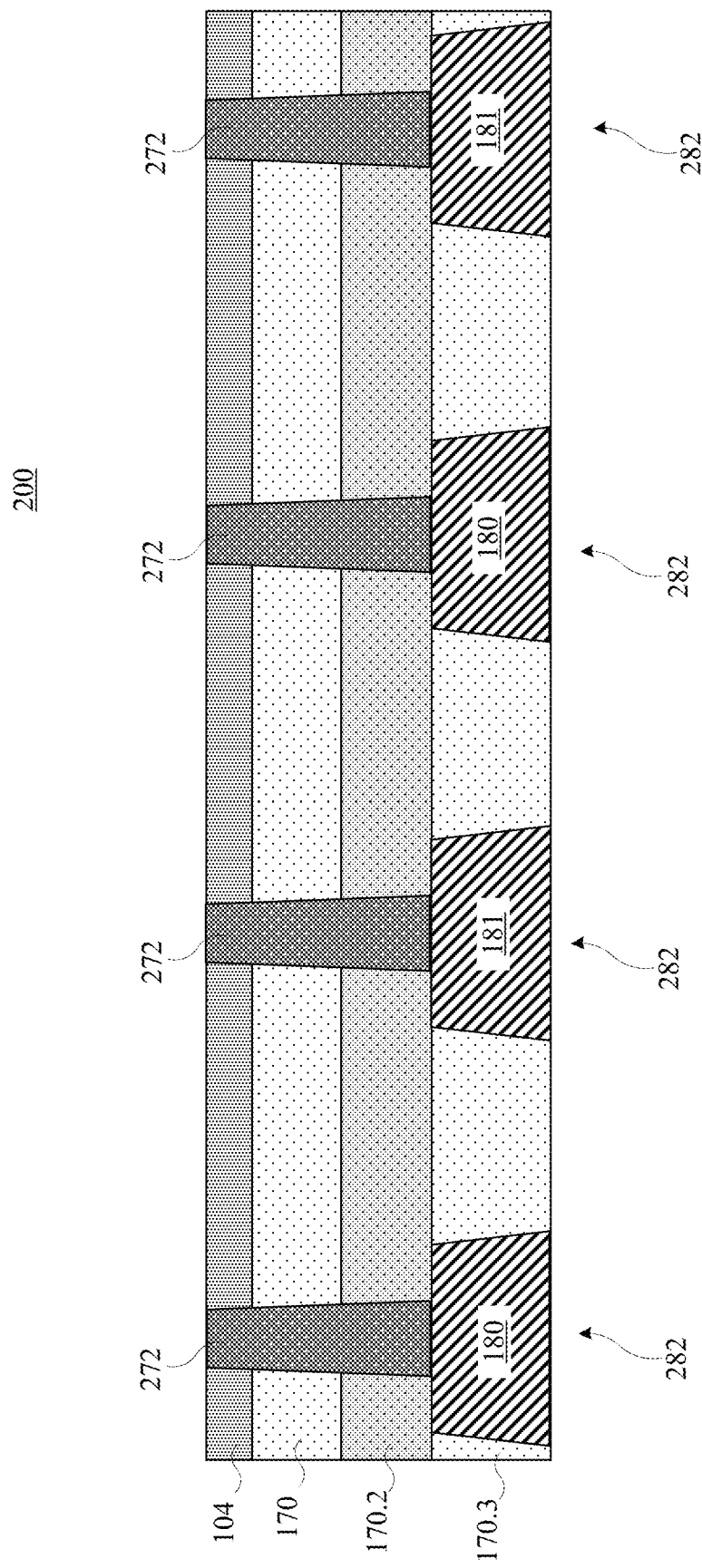

Referring now to FIG. 15, this figure depicts a cross-sectional view of a semiconductor device 200 at another stage of the fabrication process, according to embodiments. In the present fabrication stage, conductive material is deposited within the backside rail trenches 282 over a respective backside contact 272, thereby forming at least one backside power rail 180 and at least one backside ground rail 181. Backside power rail 180 and backside ground rail 181 may directly contact at least the exposed bottom surface of the associated backside contact 272. In embodiments, there may be no other conductive backside wiring feature, such as a signal line, wire, trace, or the like, between backside power rail 180 and backside ground rail 181. For example, there are no signal lines between backside power rail 180 and backside ground rail 181. Backside power rail 180 and backside ground rail 181 may include a conductive region and a conductive barrier layer(s) between the sidewalls and upper surfaces of the conductive regions and the ILD 170.3 and/or ILD 170.2. The formation of backside power rail 180 and backside ground rail 181 may include etching the ILD 170.3 to form backside rail trenches 282, forming a blanket conductive barrier layer extending into the backside rail trenches 282, depositing a metallic or conductive material over the blanket conductive barrier layer, and performing a planarization process, such as a CMP process or a mechanical grinding process, to remove excess portions of the conductive barrier layer and the conductive material. Subsequently, the bottom surface of backside power rail 180 and the bottom surface of backside ground rail 181 and the bottom surface of ILD 170.3 may be coplanar.

Figure 16:
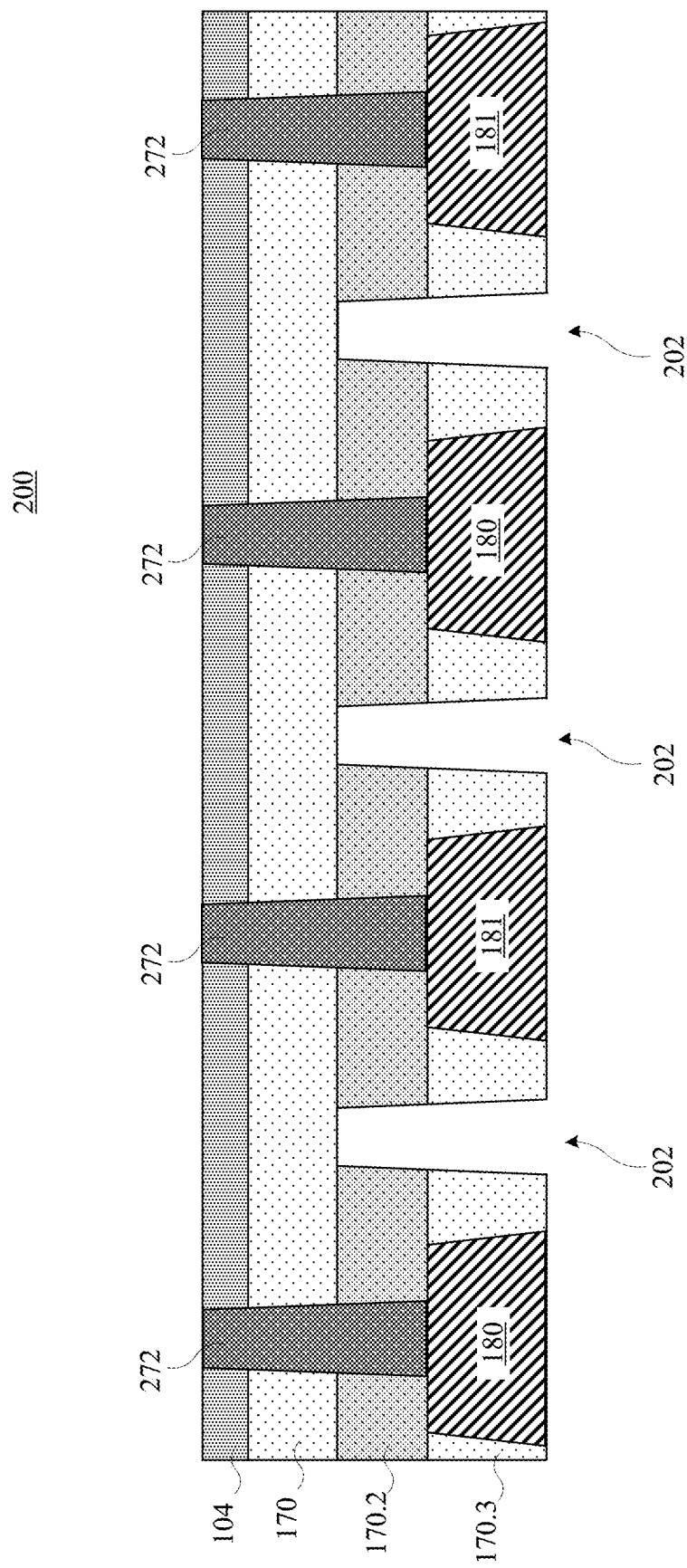

Referring now to FIG. 16, this figure depicts a cross-sectional view of a semiconductor device 200 at another stage of the fabrication process, according to embodiments. In the present fabrication stage, one or more backside isolation rail trenches 202 are formed between backside power rail 180 and backside ground rail 181. In the depicted example, the backside isolation rail trenches 202 are formed to a depth greater than the depth of backside power rail 180 and backside ground rail 181. In other words, the backside isolation rail trenches 202 may be formed in the same layer (i.e., ILD 170.3) as the backside power rail 180 and backside ground rail 181 and within one or more layer(s) thereupon (e.g., ILD 170.2). In this manner, the backside isolation rail trenches 202 may be formed within ILD 170.3 and within ILD 170.2. For example, sequential etching processes may first remove a portion of ILD 170.3 and subsequently remove another portion of ILD 170.2, utilizing ILD 170 as an etch stop.

A mask layer (not shown) may be formed on the bottom surface of ILD 170.3 and the bottom surfaces of backside power rail 180 and backside ground rail 181. The mask layer may be comprised of any suitable material(s) known to one of skill in the art. The mask layer is patterned to create openings therein at locations generally between backside power rail 180 and backside ground rail 181. Through the openings in the mask, such unprotected portions of ILD 170.3 and ILD 170.2 may be etched away or otherwise removed (e.g., reactive ion etching or RIE) to the level of the ILD 170.

As there may be no other conductive features between backside power rail 180 and backside ground rail 181, there may be no conductive features located between backside power rail 180 and backside isolation rail trench 202 or between backside ground rail 181 and backside isolation rail trench 202. For example, there may be no conductive features within ILD 170.2 and within ILD 170.3 between backside power rail 180 and backside isolation rail trench 202 and between backside ground rail 181 and backside isolation rail trench 202.

Figure 17:
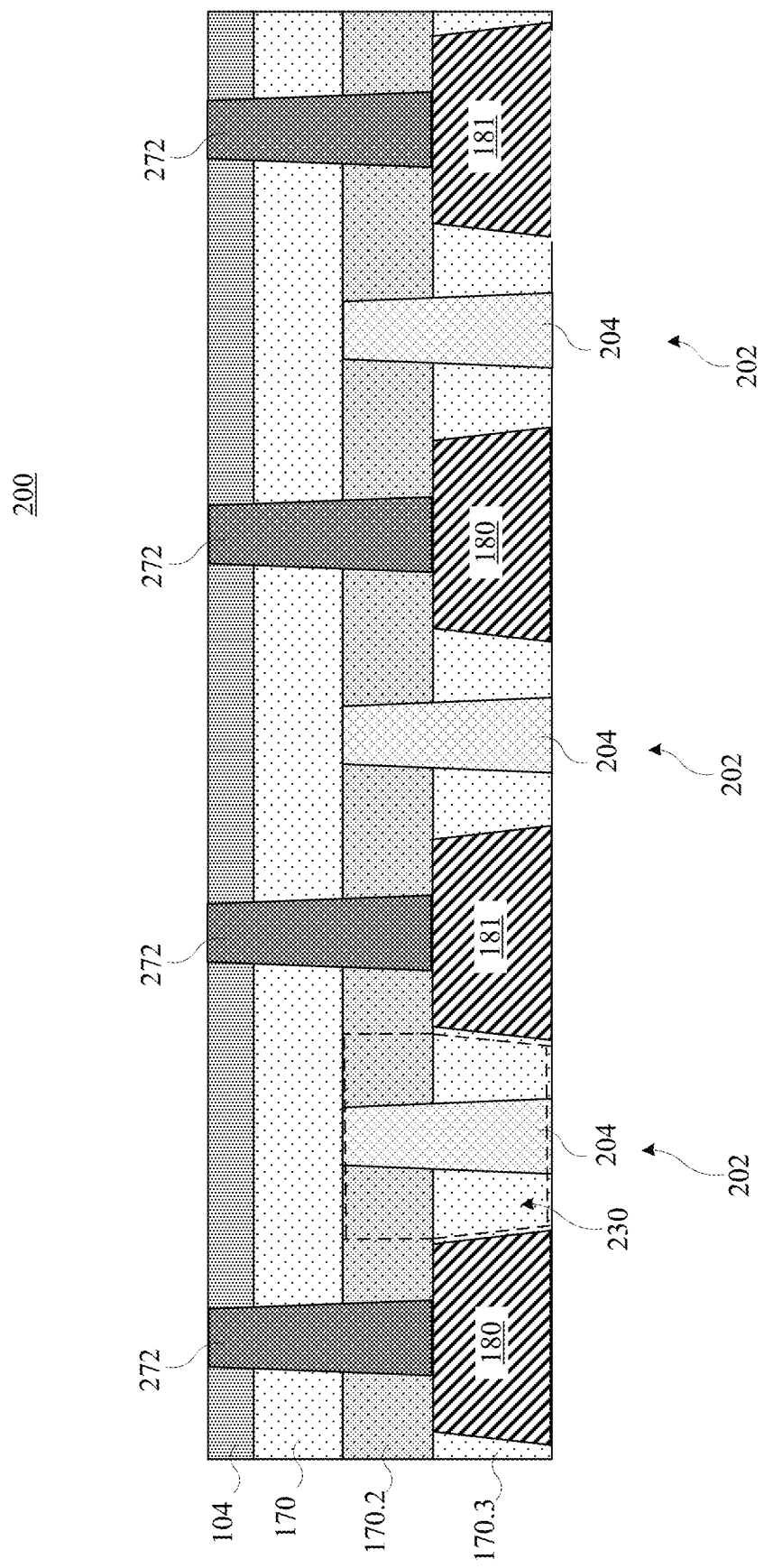

Referring now to FIG. 17, this figure depicts a cross-sectional view of a semiconductor device 200 at another stage of the fabrication process, according to embodiments. In the present fabrication stage, isolation material, such as a dielectric material, or the like, is deposited within backside isolation rail trench 202, thereby forming a backside isolation rail 204 between backside power rail 180 and backside ground rail 181.

The backside isolation rail 204 may be formed by depositing a dielectric material, such as, for example, porous silicates, carbon doped oxides, silicon dioxides, silicon nitrides, silicon oxynitrides, or other dielectric materials. In one example, backside isolation rail 204 may be a same material relative to one or more ILD 170, the ILD 170.2, or the ILD 170.3. Alternatively, as depicted, the backside isolation rail 204 may be a different material relative to the ILD 170, the ILD 170.2, and the ILD 170.3. For example, ILD 170, the ILD 170.2, and the ILD 170.3 may be one or more high-K dielectric material(s) and backside isolation rail 204 may be silicon dioxides, silicon nitrides, silicon oxynitrides, or the like. Any known manner of forming the backside isolation rail 204 can be utilized. The backside isolation rail 204 can be formed using, for example, CVD, PECVD, ALD, flowable CVD, spin-on dielectrics, or PVD.

The formation of backside isolation rail 204 may include etching the ILD 170.3 and ILD 170.2 to form backside isolation rail trench 202, forming a blanket dielectric layer extending into the backside rail trenches 282, and performing a planarization process, such as a CMP process or a mechanical grinding process, to remove excess portions of the dielectric material. Subsequently, the bottom surface of backside power rail 180, the bottom surface of backside ground rail 181, the bottom surface of ILD 170.3, and the bottom surface of backside isolation rail 204 may be coplanar.

For clarity, as there may be no other conductive features within a region 230 between backside power rail 180 and backside ground rail 181, there may be no conductive features located within region 230 between backside power rail 180 and backside isolation rail 204 or between backside ground rail 181 and backside isolation rail 204. For example, there may be no conductive features within ILD 170.2 and within ILD 170.3 within region 230 between backside power rail 180 and backside isolation rail 204 and between backside ground rail 181 and backside isolation rail 204. In a specific example, there may be no signal lines within region 230 between backside power rail 180 and backside isolation rail 204 and between backside ground rail 181 and backside isolation rail 204.

Also, for clarity, though backside power rail 180 and backside ground rail 181 are depicted as adjacent and in the same row or level (i.e., backside power rail 180 and backside ground rail 181 are in the same ILD 170.3), backside power rail 180 and backside ground rail 181 may be adjacent and nested, or in different rows. For example, backside power rail 180 may be in ILD 170.3 and backside ground rail 181 may be in ILD 170.2. In these examples, the top surface of backside isolation rail 204 may be coplanar or above the uppermost the top surface of backside power rail 180 or backside ground rail 181. In the above example, therefore, the top surface of backside isolation rail 204 may be coplanar with to top surface of ILD 170.2, the top surface of ILD 170, or the like.

Figure 18:
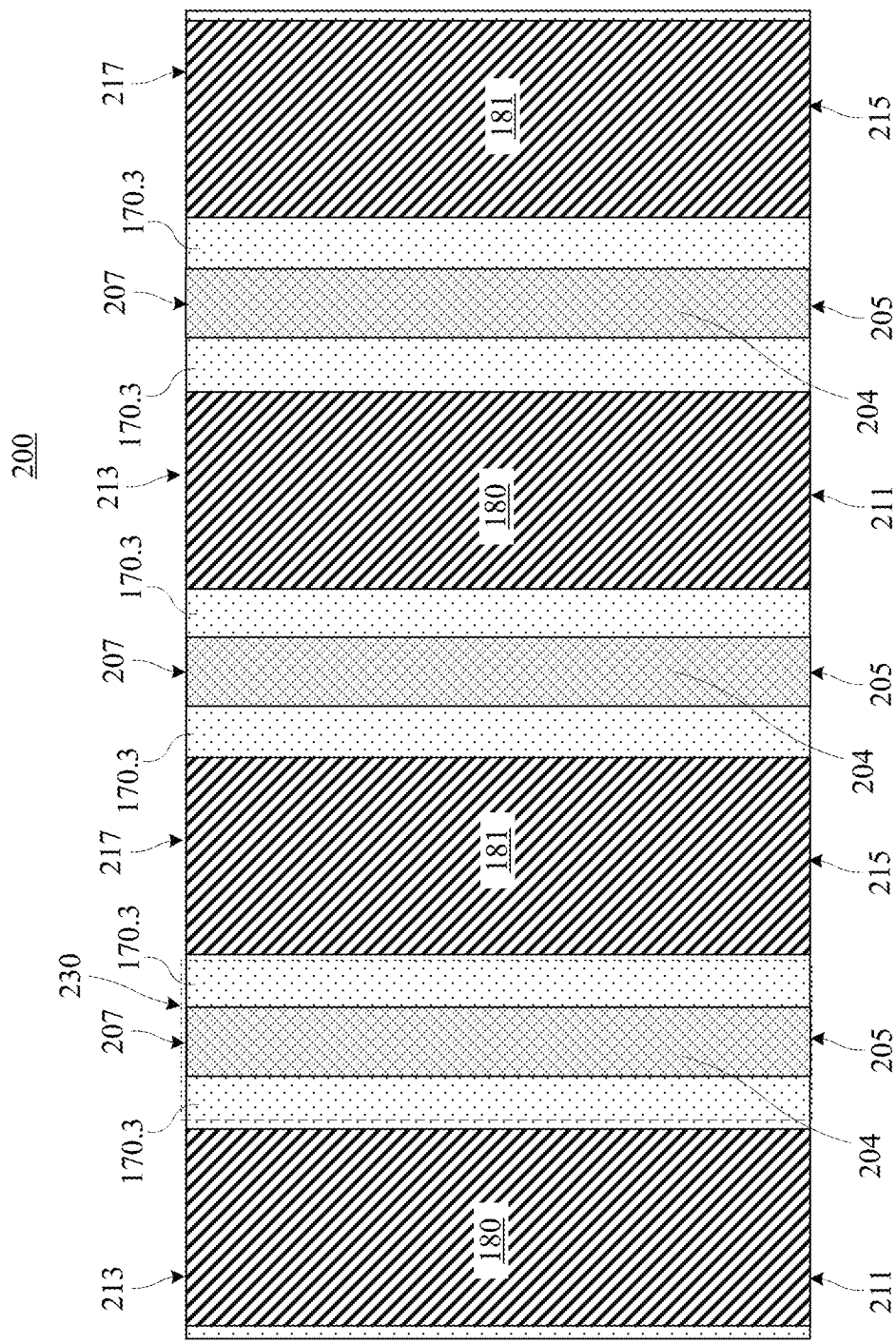

Referring now to FIG. 18, this figure depicts a normal view of semiconductor device 200 at another stage of the fabrication process, according to embodiments. For example, FIG. 18 depicts the bottom surfaces of the semiconductor device 200 depicted in FIG. 17. As depicted, a front surface 211 and a rear surface 213 of backside power rail 180 may be coplanar with an associated front surface 205 and rear surface 207 of backside isolation rail 204. Likewise, a front surface 215 and a rear surface 217 of backside ground rail 181 may be coplanar with an associated front surface 205 and rear surface 207 of backside isolation rail 204. That is, the backside isolation rail 204 may adequately electrically isolate the entire length (i.e., dimension between front surface 211 and rear surface 213) of backside power rail 180 and the backside isolation rail 204 may adequately electrically isolate the entire length (i.e., dimension between front surface 215 and rear surface 217) of backside ground rail 181.

Alternatively, the front surface 211 and the rear surface 213 of backside power rail 180 may be inset front the associated front surface 205 and rear surface 207 of backside isolation rail 204. Likewise, the front surface 215 and the rear surface 217 of backside ground rail 181 may be inset with an associated front surface 205 and rear surface 207 of backside isolation rail 204. That is, the dimension associated from front surface 205 and rear surface 207 of backside isolation rail 204 may be larger than the dimension between front surface 211 and the rear surface 213 of backside power rail 180 and may be larger than the dimension between front surface 215 and the rear surface 217 of backside ground rail 181.

In these ways, in the field or in operation conductive material migration defects that cause electrical shorting between backside power rail 180 and backside ground rail 181 may be effectively blocked or otherwise reduced by backside isolation rail 204. In other words, to prevent or minimize the propensity of migration defect caused by electrical shorting between backside power rail 180 and backside ground rail 181, backside isolation rail 204 may be located between at least the entire length(s) of neighboring backside power rail 180 and backside ground rail 181.

Figure 19:
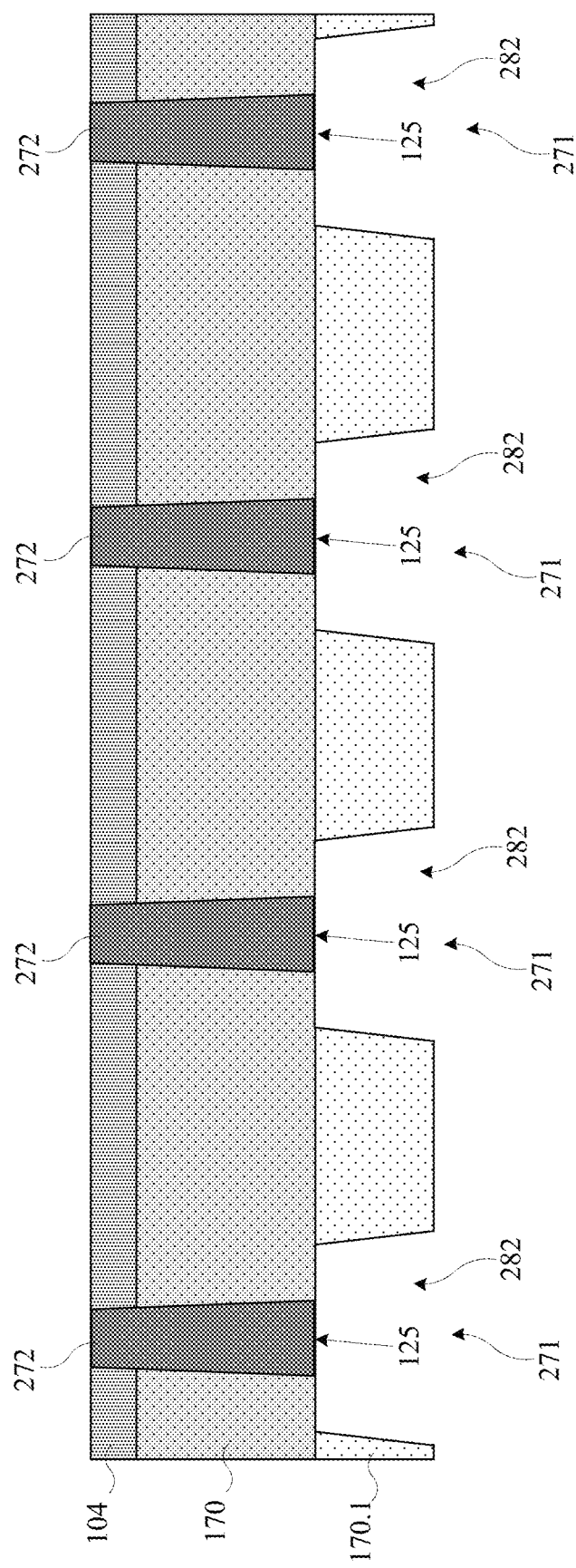

Referring now to FIG. 19, this figure depicts a cross-sectional view of an alternative semiconductor device 200 at an intermediate stage of the fabrication process, according to embodiments. In an exemplary fabrication operation, where semiconductor device 200 may be flipped for backside processing, substrate 102 is removed, and ILD 170 is formed. The substrate 102 may be removed by any removal technique, such as a combination of wafer grinding, CMP, dry and wet etch. Removal of substrate 102 exposes the bottom surface of insulator layer 104.

The ILD 170 may be formed by depositing a dielectric material, upon insulator layer 104. The ILD 170 can be any suitable material, such as, for example, porous silicates, carbon doped oxides, silicon dioxides, silicon nitrides, silicon oxynitrides, or other dielectric materials. Any known manner of forming the ILD 170 can be utilized. The ILD 170 can be formed using, for example, CVD, PECVD, ALD, flowable CVD, spin-on dielectrics, or PVD.

In the depicted example, another etch selective ILD 170.1 may be formed by depositing a dielectric material that has etch selectivity to ILD 170, upon ILD 170. The ILD 170.1 can be any suitable material, such as, for example, porous silicates, carbon doped oxides, silicon dioxides, silicon nitrides, silicon oxynitrides, or other dielectric materials with etch selectivity to ILD 170. Any known manner of forming the ILD 170.1 can be utilized. The ILD 170.1 can be formed using, for example, CVD, PECVD, ALD, flowable CVD, spin-on dielectrics, or PVD.

Subsequently, backside contact trenches 271 are formed. The backside contact trenches 271 are formed from the backside of semiconductor device through ILD 170 and through insulator layer 104 and may expose a portion of the bottom surface of an associated electrical node of one or more IC microdevice(s) there above. In some examples, these electrical node(s) of the IC microdevice(s) may be an etch stop in the formation of respective backside contact trenches 271.

Subsequently, a backside contact 272 is formed within each backside contact trench 271. Each backside contact 272 may directly contact at least the exposed electrical node(s) of the IC microdevice(s) there above. The backside contact 272 may consist of a silicide liner, such as Ni, NiPt or Ti, etc., a metal adhesion liner, such as TiN, TaN, etc., and a conductive metal fill, such as Al, Ru, W, Co, Cu, etc. In some examples, backside contact 272 may be a contact feature, such as a vertical interconnect access (VIA) to a backside power rail 180 or a backside ground rail 181, respectively shown in FIG. 20, such as a backside wiring line, backside power plane, or the like. The formation of the backside contact 272 may include etching ILD 170 and etching insulator layer 104 to form via openings, forming a blanket conductive barrier layer extending into the via openings, depositing a metallic or conductive material over the blanket conductive barrier layer, and performing a planarization process, such as a CMP process or a mechanical grinding process, to remove excess portions of the conductive barrier layer and the conductive material. Subsequently, the bottom surface 125 of backside contact 272 and the bottom surface of ILD 170 may be coplanar.

Subsequently, ILD 170.1 is formed upon the bottom surface of ILD 170 and the respective bottom surface of backside contacts 272. The ILD 170.1 may be formed by depositing a dielectric material, such as, for example, porous silicates, carbon doped oxides, silicon dioxides, silicon nitrides, silicon oxynitrides, or other dielectric materials. As depicted, the ILD 170.1 may be a material with etch selectivity to the material relative to the ILD 170. Any known manner of forming the ILD 170.1 can be utilized. The ILD 170.1 can be formed using, for example, CVD, PECVD, ALD, flowable CVD, spin-on dielectrics, or PVD.

Subsequently, one or more backside rail trenches 282 are formed within ILD 170.3. One backside rail trench 282 may expose the entire bottom surface of a respective backside contact 272. A mask layer (not shown) may be formed on the bottom surface of ILD 170.1. The mask layer may be comprised of any suitable material(s) known to one of skill in the art. The mask layer is patterned to create openings therein at locations generally below backside contacts 272. Through the openings in the mask, such unprotected portions of ILD 170.1 may be etched away or otherwise removed (e.g., reactive ion etching or RIE) to the level of the ILD 170.

Figure 20:
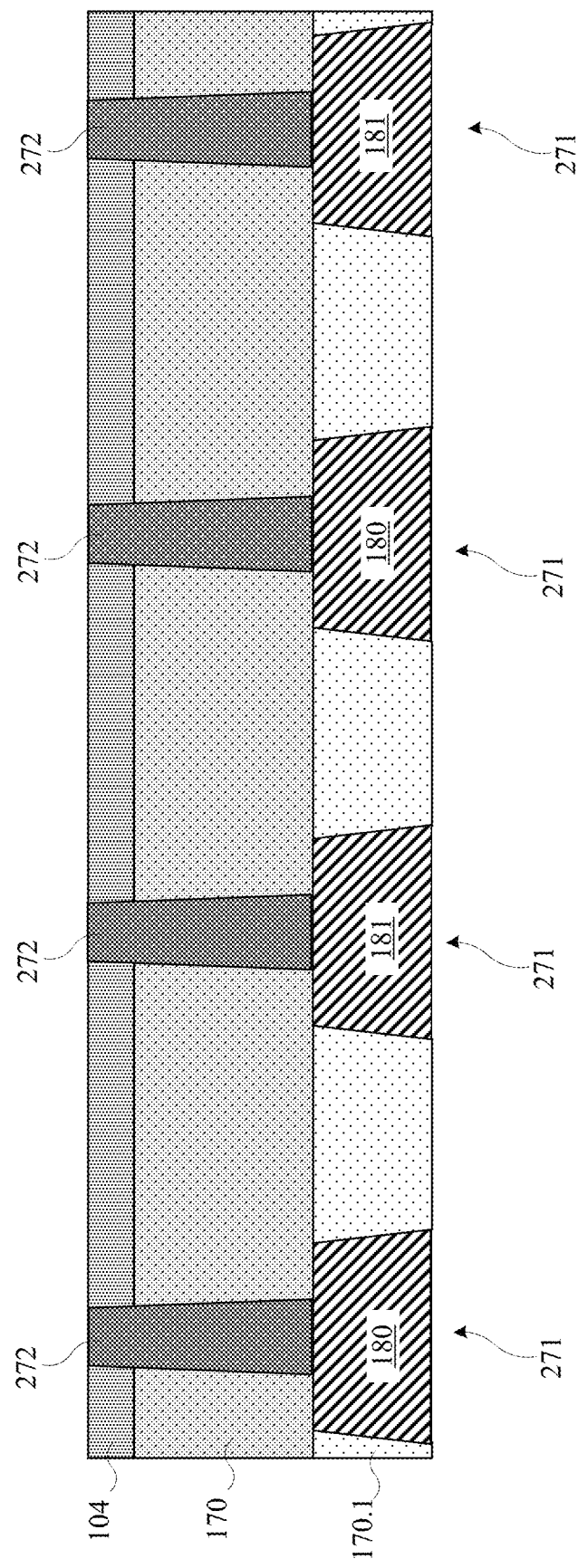

Referring now to FIG. 20, this figure depicts a cross-sectional view of a semiconductor device 200 at another stage of the fabrication process, according to embodiments. In the present fabrication stage, conductive material is deposited within the backside rail trenches 282 (shown in FIG. 19) over a respective backside contact 272, thereby forming at least one backside power rail 180 and at least one backside ground rail 181. Backside power rail 180 and backside ground rail 181 may directly contact at least the exposed bottom surface of the associated backside contact 272. In embodiments, there may be no other conductive backside wiring feature, such as a signal line, wire, trace, or the like, between backside power rail 180 and backside ground rail 181. For example, there are no signal lines between backside power rail 180 and backside ground rail 181. Backside power rail 180 and backside ground rail 181 may include a conductive region and a conductive barrier layer(s) between the sidewalls and upper surfaces of the conductive regions and the ILD 170.1 and/or ILD 170. The formation of backside power rail 180 and backside ground rail 181 may include etching the ILD 170.1 to form backside rail trenches 282, forming a blanket conductive barrier layer extending into the backside rail trenches 282, depositing a metallic or conductive material over the blanket conductive barrier layer, and performing a planarization process, such as a CMP process or a mechanical grinding process, to remove excess portions of the conductive barrier layer and the conductive material. Subsequently, the bottom surface of backside power rail 180 and the bottom surface of backside ground rail 181 and the bottom surface of ILD 170.1 may be coplanar.

Figure 21:
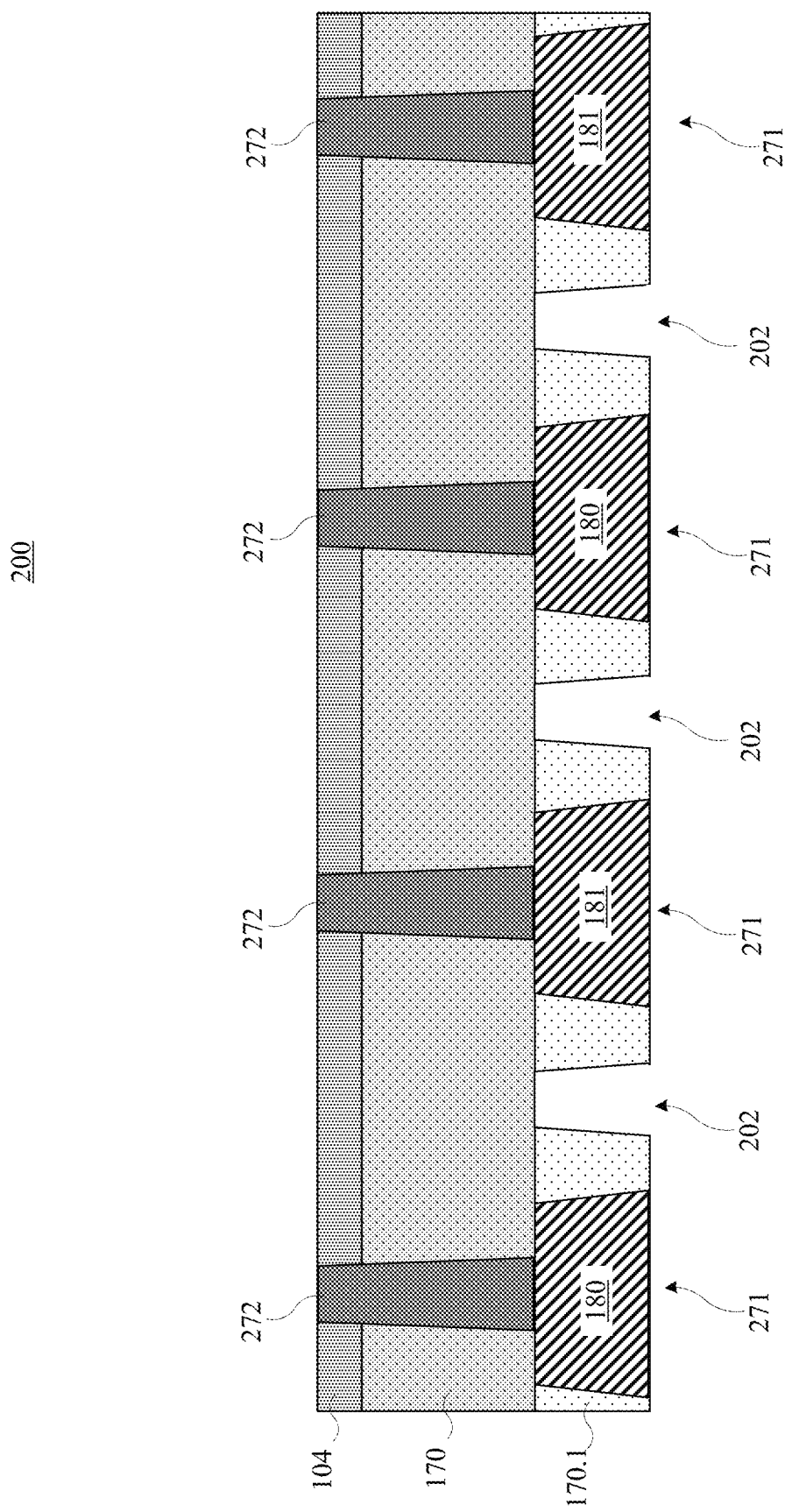

Referring now to FIG. 21, this figure depicts a cross-sectional view of a semiconductor device 200 at another stage of the fabrication process, according to embodiments. In the present fabrication stage, one or more backside isolation rail trenches 202 are formed between backside power rail 180 and backside ground rail 181. In the depicted example, the backside isolation rail trenches 202 are formed to a same depth relative to backside power rail 180 and backside ground rail 181. In other words, the backside isolation rail trenches 202 may be formed in the same layer (i.e., ILD 170.1) as the backside power rail 180 and backside ground rail 181.

A mask layer (not shown) may be formed on the bottom surface of ILD 170.1 and the bottom surfaces of backside power rail 180 and backside ground rail 181. The mask layer may be comprised of any suitable material(s) known to one of skill in the art. The mask layer is patterned to create openings therein at locations generally between backside power rail 180 and backside ground rail 181. Through the openings in the mask, such unprotected portions of ILD 170.1 may be etched away or otherwise removed (e.g., reactive ion etching or RIE) to the level of the ILD 170.

As there may be no other conductive features between backside power rail 180 and backside ground rail 181, there may be no conductive features located between backside power rail 180 and backside isolation rail trench 202 or between backside ground rail 181 and backside isolation rail trench 202. For example, there may be no conductive features within ILD 170.1 between backside power rail 180 and between backside ground rail 181.

Figure 22:
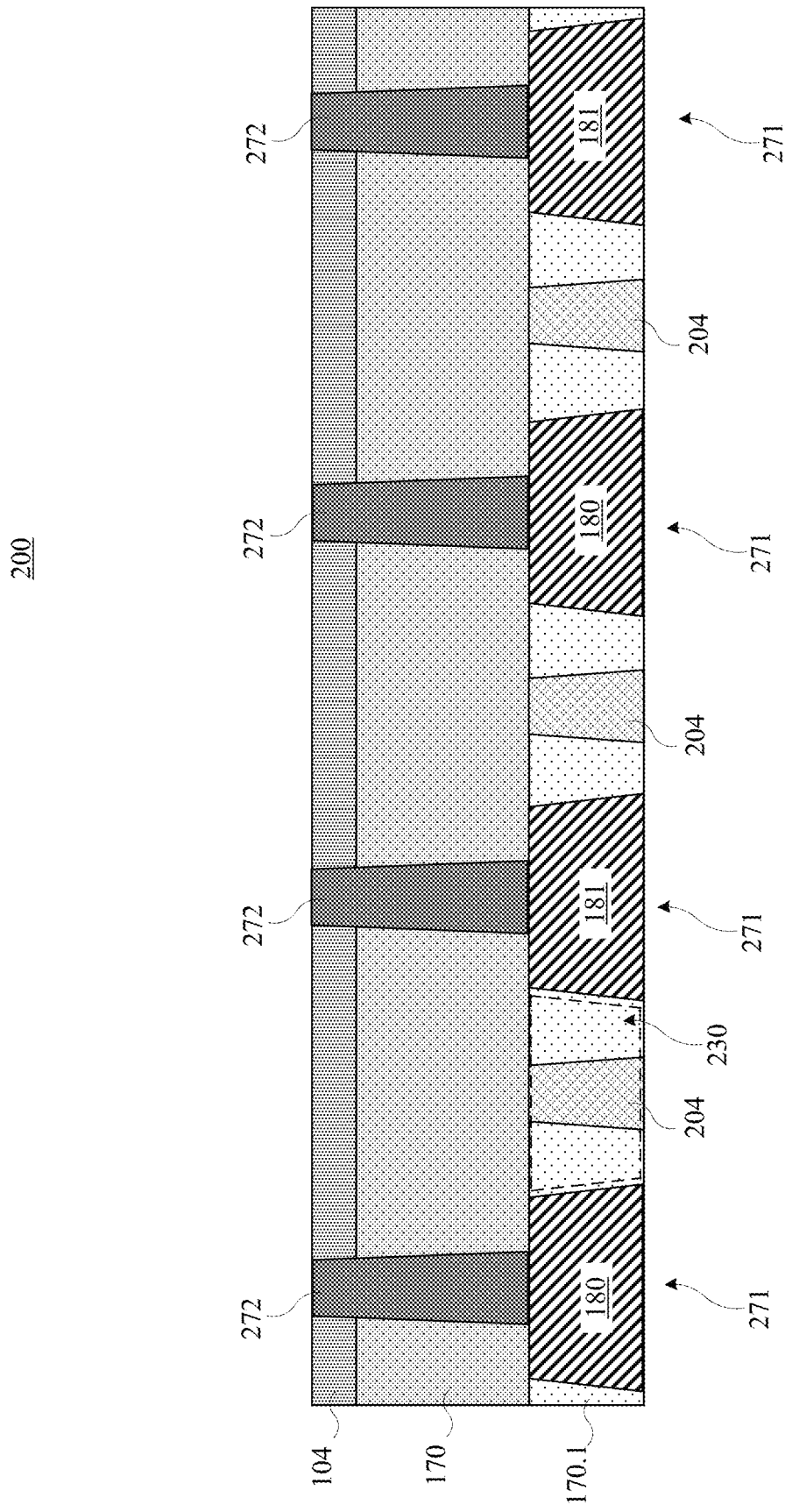

Referring now to FIG. 22, this figure depicts a cross-sectional view of a semiconductor device 200 at another stage of the fabrication process, according to embodiments. In the present fabrication stage, isolation material, such as a dielectric material, or the like, is deposited within backside isolation rail trench 202, thereby forming a backside isolation rail 204 between backside power rail 180 and backside ground rail 181.

The backside isolation rail 204 may be formed by depositing a dielectric material, such as, for example, porous silicates, carbon doped oxides, silicon dioxides, silicon nitrides, silicon oxynitrides, or other dielectric materials. In one example, backside isolation rail 204 may be a same material relative to one or more ILD 170, the ILD 170.1. Alternatively, as depicted, the backside isolation rail 204 may be a different material relative to the ILD 170 and the ILD 170.1. For example, ILD 170 and the ILD 170.1 may be one or more high-K dielectric material(s) and backside isolation rail 204 may be silicon dioxides, silicon nitrides, silicon oxynitrides, or the like. Any known manner of forming the backside isolation rail 204 can be utilized. The backside isolation rail 204 can be formed using, for example, CVD, PECVD, ALD, flowable CVD, spin-on dielectrics, or PVD.

The formation of backside isolation rail 204 may include etching the ILD 170.1 to form backside isolation rail trench 202 (shown in FIG. 21), forming a blanket dielectric layer extending into the backside rail trenches 282, and performing a planarization process, such as a CMP process or a mechanical grinding process, to remove excess portions of the dielectric material. Subsequently, the bottom surface of backside power rail 180, the bottom surface of backside ground rail 181, the bottom surface of ILD 170.1, and the bottom surface of backside isolation rail 204 may be coplanar.

For clarity, as there may be no other conductive features within a region 230 between backside power rail 180 and backside ground rail 181, there may be no conductive features located within region 230 between backside power rail 180 and backside isolation rail 204 or between backside ground rail 181 and backside isolation rail 204. For example, there may be no conductive features within ILD 170.1 within region 230 between backside power rail 180 and backside isolation rail 204 and between backside ground rail 181 and backside isolation rail 204. In a specific example, there may be no signal lines within region 230 between backside power rail 180 and backside isolation rail 204 and between backside ground rail 181 and backside isolation rail 204.

For clarity, though semiconductor device 200 is depicted with a single backside isolation rail between backside power rail 180 and backside ground rail 181, multiple backside isolation rails 204 may be located between backside power rail 180 and backside ground rail 181.

Figure 23:
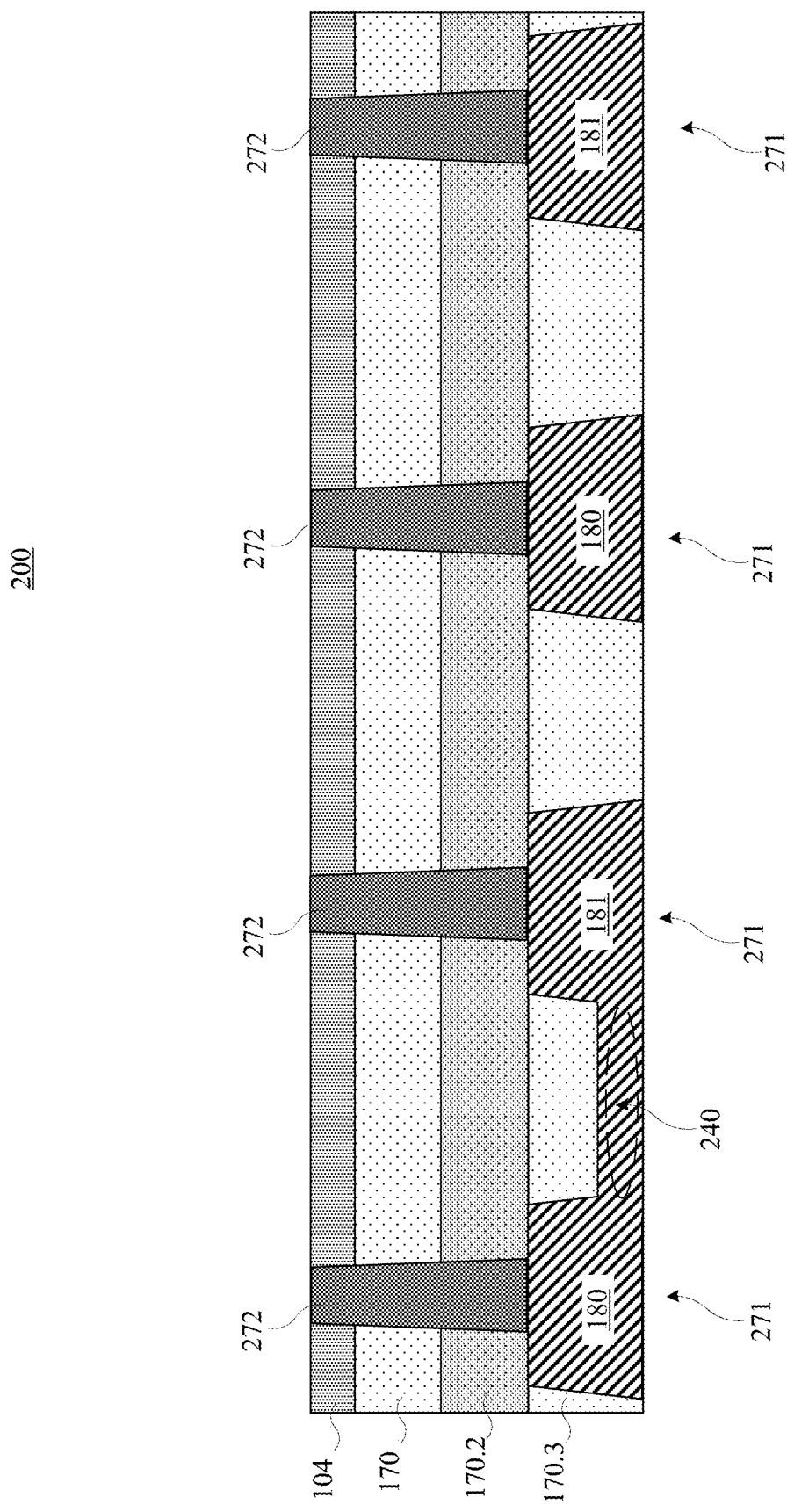

Referring now to FIG. 23, this figure depicts a cross-sectional view of a semiconductor device 200, according to embodiments. In the present fabrication stage, conductive material is deposited within the backside rail trenches 282 over a respective backside contact 272, thereby forming at least one backside power rail 180 and at least one backside ground rail 181. Backside power rail 180 and backside ground rail 181 may directly contact at least the exposed bottom surface of the associated backside contact 272, respectively.

In the depicted example, a defect has caused an electrical short region 240 between backside power rail 180 and backside ground rail 181. In other words, conductive material has undesirably formed or was undesirably deposited between backside power rail 180 and backside ground rail 181. The conductive electrical short region 240 generally directly connects backside power rail 180 and backside ground rail 181, thereby shorting backside power rail 180 and backside ground rail 181. This type of electrical shorting may be caused by various defects, such as tunneling defects, backside power rail 180 or backside ground rail 181 conductive material deposition defects, backside rail trenches 282 formation defects, or the like.

Figure 24:
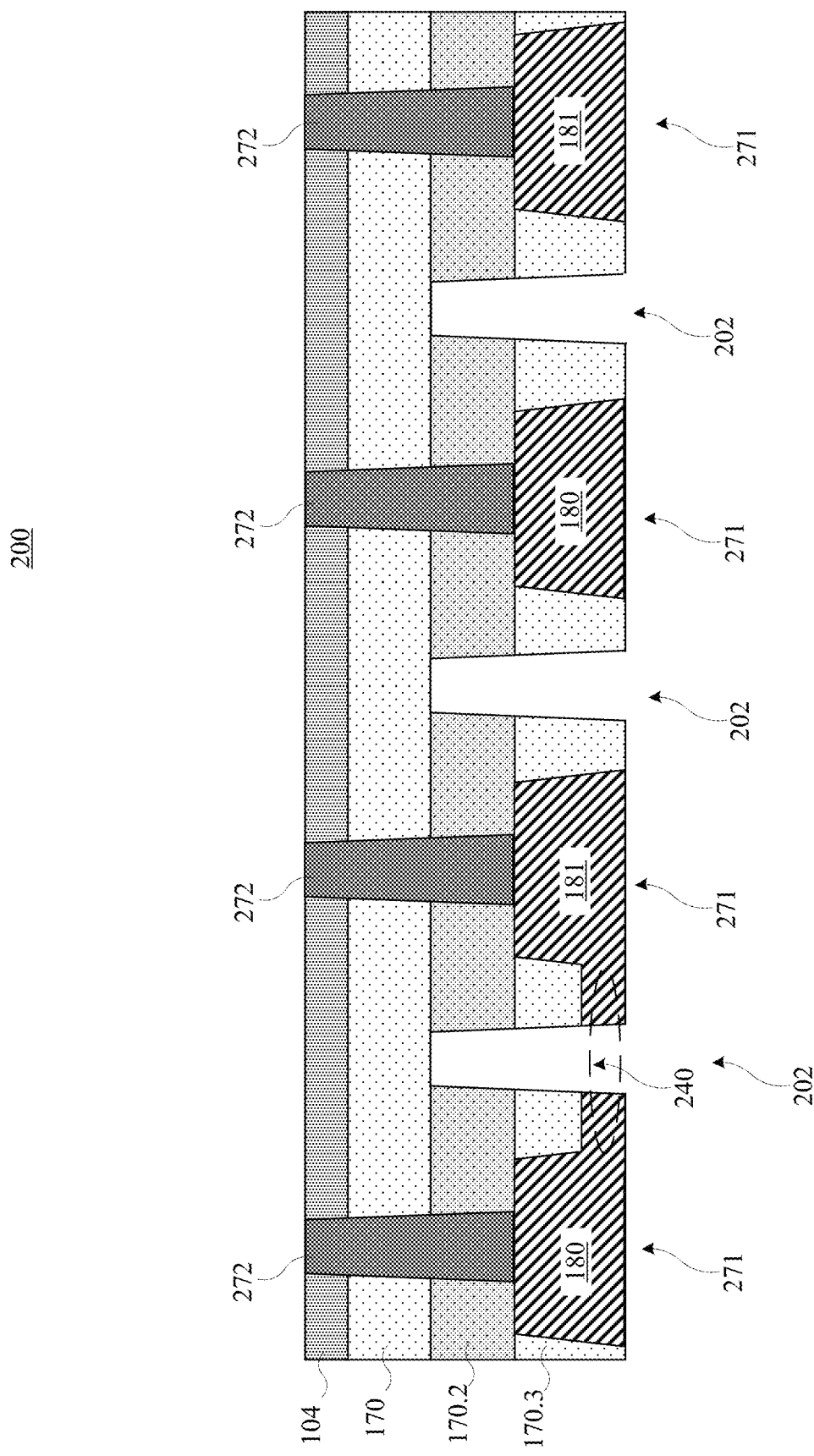

Referring now to FIG. 24, this figure depicts a cross-sectional view of a semiconductor device 200 at another stage of the fabrication process, according to embodiments. In the present fabrication stage, one or more backside isolation rail trenches 202 are formed between backside power rail 180 and backside ground rail 181 and through electrical short region 240. The formation of such backside isolation rail trench 202 may physically separate, split, or the like, electrical short region 240. In other words, the backside isolation rail trench 202 through electrical short region 240 physically separate backside power rail 180 and backside ground rail 181.

Figure 25:
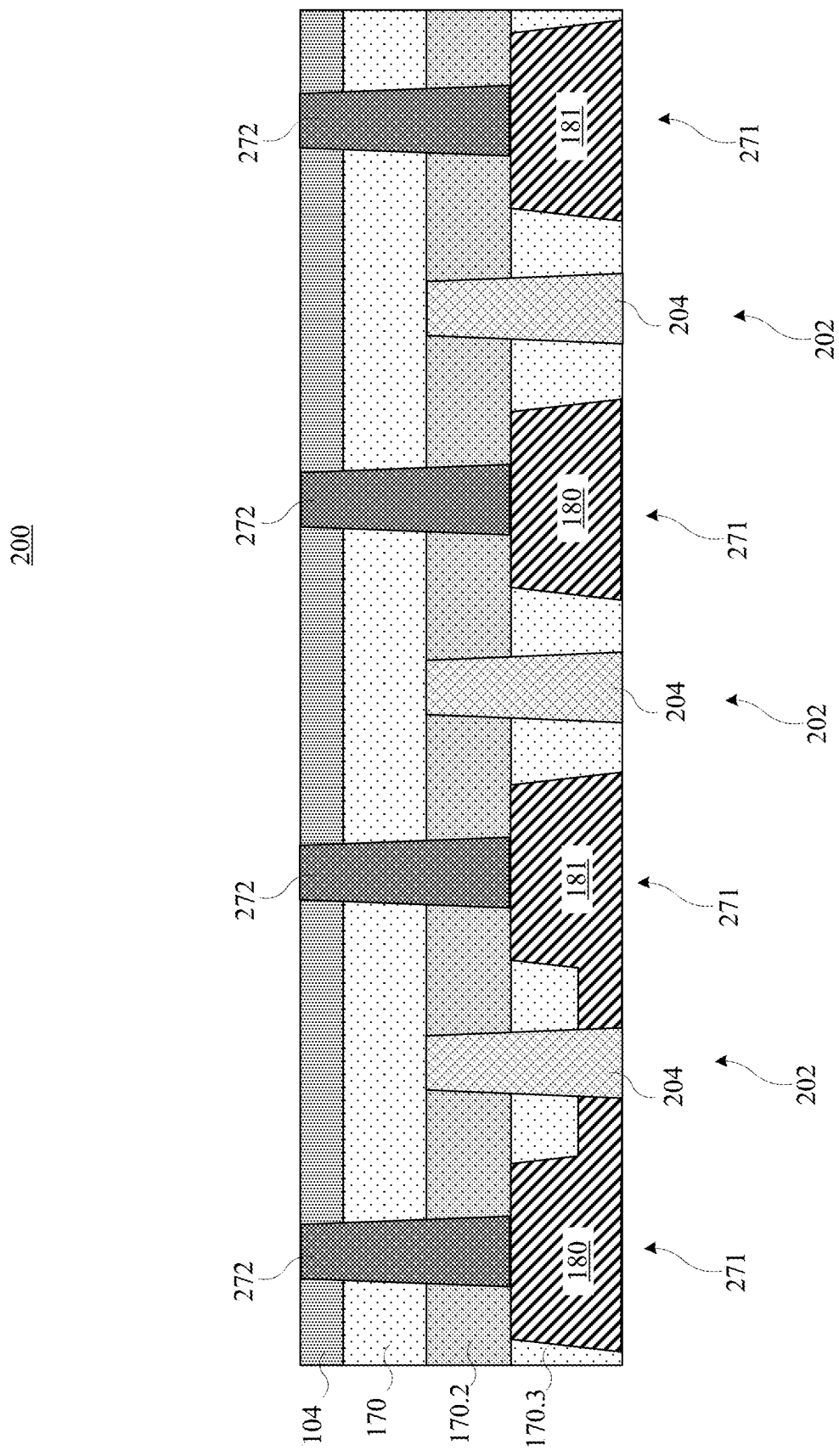

Referring now to FIG. 25, this figure depicts a cross-sectional view of a semiconductor device 200 at another stage of the fabrication process, according to embodiments. In the present fabrication stage, isolation material, such as a dielectric material, or the like, is deposited within backside isolation rail trench 202, thereby forming a backside isolation rail 204 between backside power rail 180 and backside ground rail 181. The formation of backside isolation rail 204 may physically separate, split, or the like, and adequately electrically isolate the split portions of electrical short region 240 (shown in FIG. 24). In other words, the backside isolation rail 204 physically separates and adequately electrically isolates the electrical short region 240 portion of backside power rail 180 from the electrical short region 240 portion of backside ground rail 181.

Figure 26:
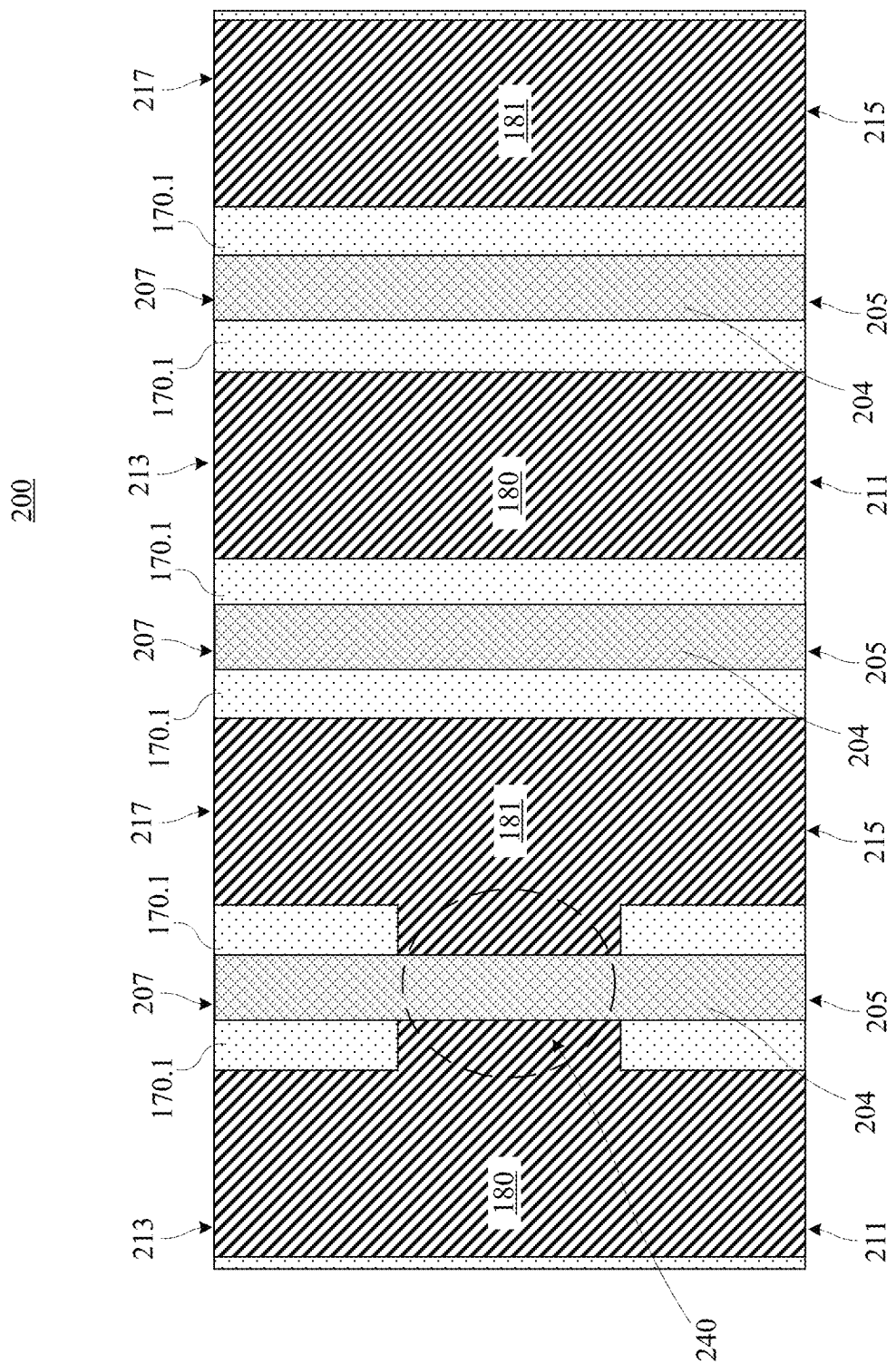

Referring now to FIG. 26, this figure depicts a normal view of semiconductor device 200, according to embodiments. For example, FIG. 26 depicts the bottom surfaces of the semiconductor device 200 depicted in FIG. 25. As depicted, a front surface 211 and a rear surface 213 of backside power rail 180 may be coplanar with an associated front surface 205 and rear surface 207 of backside isolation rail 204. Likewise, a front surface 215 and a rear surface 217 of backside ground rail 181 may be coplanar with an associated front surface 205 and rear surface 207 of backside isolation rail 204. That is, the backside isolation rail 204 may adequately electrically isolate the entire length (i.e., dimension between front surface 211 and rear surface 213) of backside power rail 180 and the backside isolation rail 204 may adequately electrically isolate the entire length (i.e., dimension between front surface 215 and rear surface 217) of backside ground rail 181. Further, as depicted, dimension of associated front surface 205 and rear surface 207 of backside isolation rail 204 may be greater than the associated dimension of electrical short region 240. As such, the backside isolation rail 204 may adequately physically separate and electrically isolate the portions of electrical short region 240 along the entire length thereof.

In this way, electrical short region 240 between backside power rail 180 and backside ground rail 181 may be effectively cured by backside isolation rail 204. In other words, backside isolation rail 204 may cure or fix actual electrical shorting between backside power rail 180 and backside ground rail 181.

Figure 27:
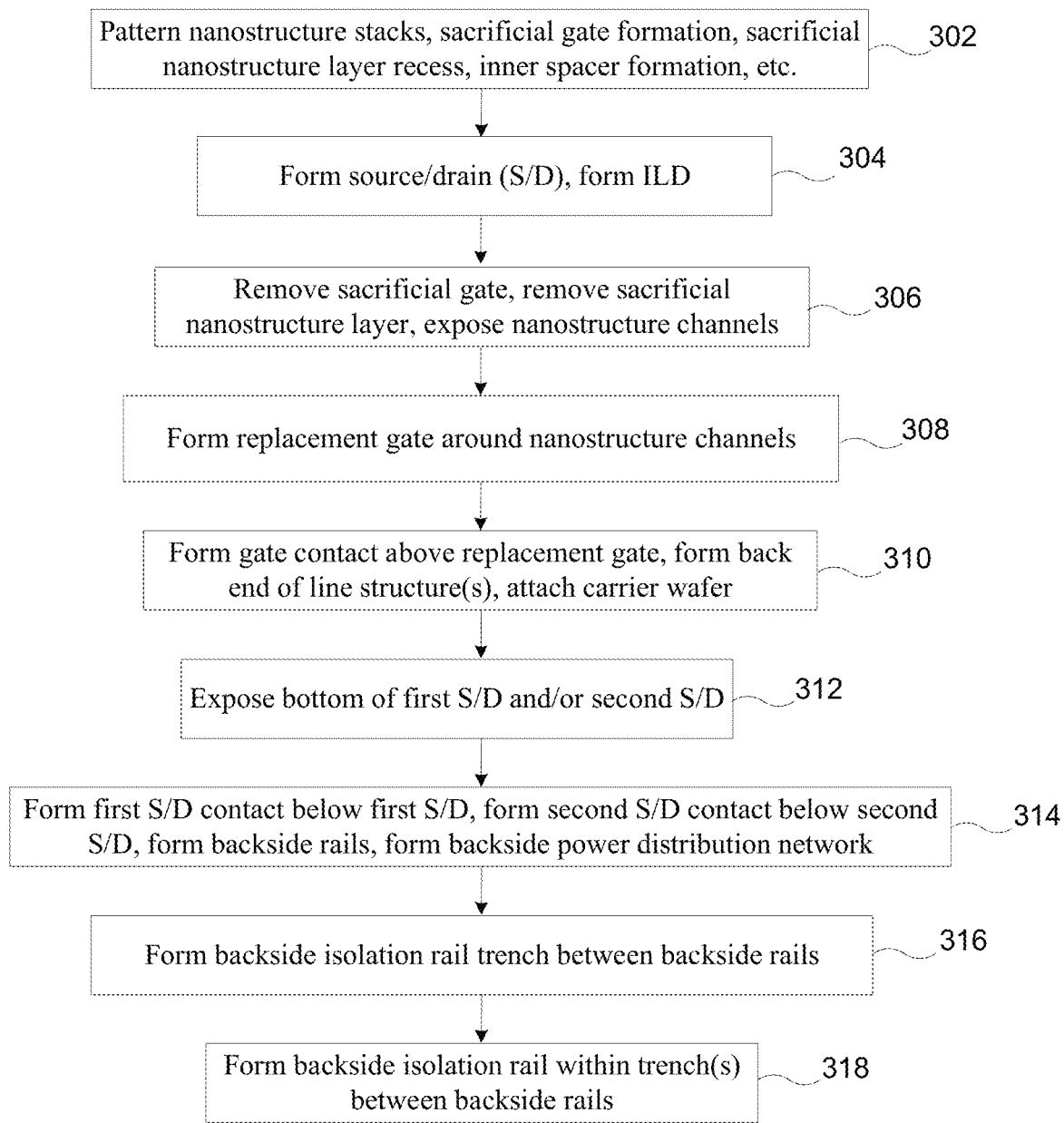
FIG. 27 and FIG. 28 depict methods of fabricating a semiconductor device that includes a backside power rail, a backside ground rail, and a backside isolation rail, according to embodiments.

FIG. 27 depicts a process 300 of fabricating semiconductor device that includes backside isolation rail 204 between backside power rail 180 and backside ground rail 181, according to embodiments. Process 300 begins at block 302 with patterning a nanostructure stack, forming a sacrificial gate structure around the nanostructure stack, forming a gate spacer around the sacrificial gate structure, directionally recessing the sacrificial nanostructure layers of the nanostructure stack that are under the gate spacer, and forming inner spacers within the recesses formed by the directional spacing.

At block 304, a S/D region is formed on either side of the patterned nanostructure stack. For example, a first S/D region 124 is formed one a first side of the patterned nanostructure stack and a second S/D region 124 is formed on an opposing second side of the patterned nanostructure stack. The S/D region 124 may contact respective first end surfaces of the active semiconductor layers 108 of the patterned nanostructure stack. In some examples, ILD 126 may be formed upon the S/D region(s) 124.

At block 306, the sacrificial gate structure is removed, the sacrificial nanostructure layers within the nanostructure stack are removed, and the active semiconductor layers (i.e., the nanostructure channels) are exposed. For example, sacrificial gate 116 is removed, sacrificial layers 106 are removed, and active semiconductor layers 108 are exposed. At block 308, a replacement gate structure 135 is formed around the nanostructure channels. For example, replacement gate structure 135 is formed around the exposed active semiconductor layers 108.

At block 310, a gate contact is formed above or over the replacement gate structure, BEOL structures are formed over the first S/D contact, and a carrier wafer is attached to the top surface or front side of the semiconductor device 100. For example, gate contact 160 is formed upon and contacts the top surface of the replacement gate structure 135. BEOL structures 162 are formed over the gate contact 160, and carrier wafer 164 is attached.

At block 312, at least the bottom surface of the first S/D region 124 and/or the second S/D region 124 is exposed from the backside. For example, using the carrier wafer 164, the semiconductor device is flipped and substrate 102 may be removed and replaced with ILD 170. One or more backside contact trenches 171 may be formed within ILD 170 that exposes at least a portion of the bottom surface of the first S/D region 124 and/or the second S/D region 124, respectively.

At block 314, a respective S/D contact is formed below the S/D region(s) 124, a backside power rail and a backside ground rail are formed below the S/D contact(s), and/or a BSPSN is formed below the backside power rail. For example, S/D contacts 172 may be formed within the backside contact trench(es) 171, backside power rail 180 and backside ground rail 181 may be formed below one S/D contact 172, respectively, and BSPDN 182 may be formed below the backside power rail 180 and the backside ground rail 181.

At block 316, a backside isolation rail trench 202 is formed between the backside power rail 180 and the backside ground rail 181, and at block 318 a backside isolation rail 204 is formed within the backside isolation rail trench 202 between the backside power rail 180 and the backside ground rail 181.

Figure 28:
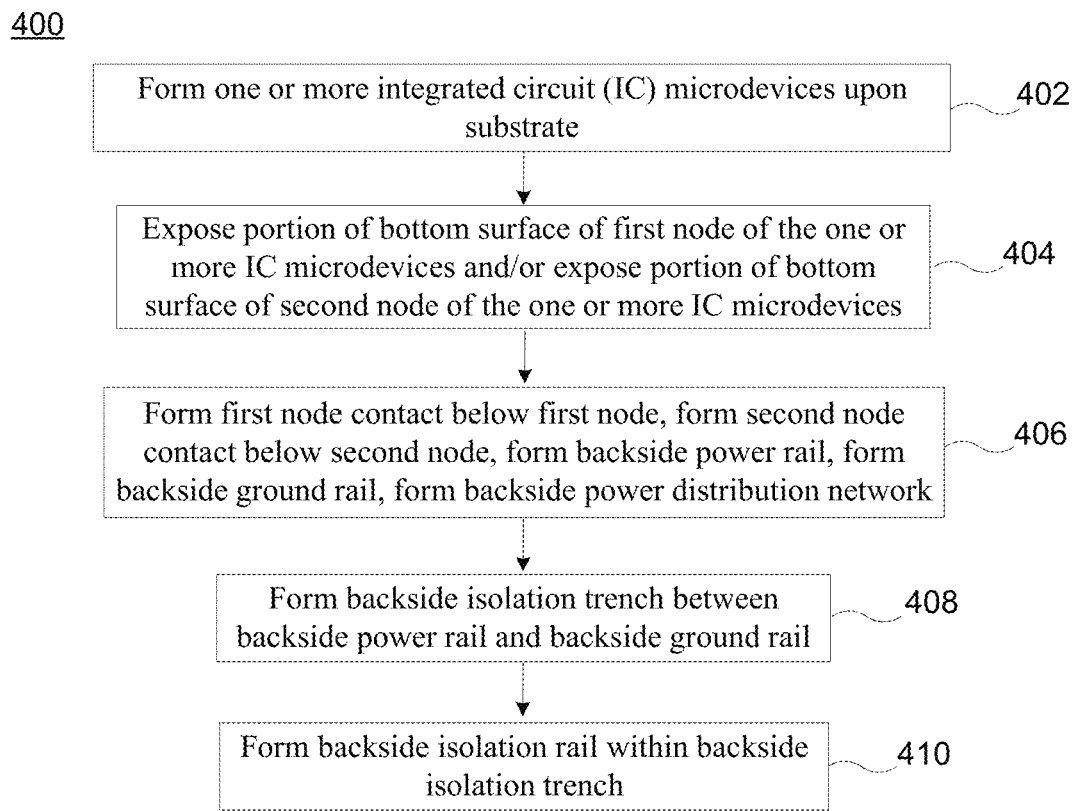

FIG. 28 depicts a process 400 of fabricating semiconductor device that includes backside isolation rail 204 between backside power rail 180 and backside ground rail 181, according to embodiments. Process 400 begins at block 402 with forming an IC microdevice, such as a FET, diode, storage cell or the like, upon or within a substrate. The one or more IC microdevices may include at least two nodes, such as source and drain, such as in input node and an output node, or the like. For example, one IC microdevice may include a first node and a second node, a first IC microdevice may include the first node and an electrically connected second IC microdevice may include the second node.

At block 404, a portion of the bottom surface of the first node is exposed and a portion of the bottom surface of the second node is exposed. For example, a portion of a bottom surface of a first S/D region 124 is exposed and a portion of a bottom surface of a second S/D region 124 is exposed. For example, one or more backside contact trenches 171 may be formed within ILD 170 that exposes at least a portion of the bottom surface of bottom surface of the first node and second node, respectively.

At block 406, a respective node contact is formed below the first node and/or the second node. For example, a node contact (e.g., S/D contact 172, or the like) is formed within the backside contact trenches 171 and may contact the exposed portion of the associated first node or second node, respectively. Further at block 406, a backside power rail and a backside ground rail are formed below the node contact(s), and/or a BSPSN is formed below the backside power rail and/or below the backside ground rail. For example, backside power rail 180 and backside ground rail 181 may be formed below and contact one of the node contacts, respectively, and BSPDN 182 may be formed below the backside power rail 180 and the backside ground rail 181. As such, potential may be supplied to the one or more IC microdevices by way of the backside power rail 180 to the first node of the one or more IC microdevices and ground potential may be supplied to the one or more IC microdevices by way of the backside ground rail 181 to the second node of the one or more IC microdevices.

At block 408, a backside isolation rail trench 202 is formed between the backside power rail 180 and the backside ground rail 181, and at block 410 a backside isolation rail 204 is formed within the backside isolation rail trench 202 between the backside power rail 180 and the backside ground rail 181.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a substrate;
one or more integrated circuit (IC) microdevices upon the substrate, the one or more IC microdevices include a first node and a second node;
a first backside contact connected to a portion of a bottom surface of the first node and a second backside contact connected to a portion of a bottom surface of the second node;
a backside power rail connected to the first backside contact and a backside ground rail connected to the second node; and
a backside isolation rail between the backside power rail and the backside ground rail.

2. The semiconductor device of claim 1, wherein a top surface of the backside power rail is below a top surface of the backside isolation rail.

3. The semiconductor device of claim 1, wherein a top surface of the backside ground rail is below a top surface of the backside isolation rail.

4. The semiconductor device of claim 1, wherein the backside power rail and the backside ground rail are within a first layer of a first dielectric material.

5. The semiconductor device of claim 4, wherein the backside isolation rail is formed of a second dielectric material different than the first dielectric material.

6. The semiconductor device of claim 4, wherein a sidewall of the backside power rail abuts against the first dielectric material and wherein a first sidewall of the backside isolation rail abuts against the first dielectric material.

7. The semiconductor device of claim 6, wherein a sidewall of the backside ground rail abuts against the first dielectric material and wherein a second sidewall of the backside isolation rail abuts against the first dielectric material.

8. The semiconductor device of claim 1, wherein a front surface of the backside ground rail is coplanar with a front surface of the backside isolation rail and wherein a rear surface of the backside ground rail is coplanar with a rear surface of the backside isolation rail.

9. The semiconductor device of claim 1, wherein a front surface of the backside power rail is coplanar with a front surface of the backside isolation rail and wherein a rear surface of the backside power rail is coplanar with a rear surface of the backside isolation rail.

10. The semiconductor device of claim 1, wherein a front surface of the backside power rail and a front surface of the backside ground rail are inset relative to a front surface of the backside isolation rail and wherein a rear surface of the backside power rail and a rear surface of the backside ground rail are inset relative to a rear surface of the backside isolation rail.

11. A method of forming a semiconductor device, the method comprising:
forming a backside power rail and a backside ground rail through a dielectric layer; and
subsequent to forming the backside power rail and the backside ground rail, forming a backside isolation rail through the dielectric layer between the backside power rail and the backside ground rail.

12. The method of forming the semiconductor device of claim 11, wherein a top surface of the backside power rail is below a top surface of the backside isolation rail.

13. The method of forming the semiconductor device of claim 11, wherein a top surface of the backside ground rail is below a top surface of the backside isolation rail.

14. The method of forming the semiconductor device of claim 11, wherein the backside power rail and the backside ground rail are within a first layer of a first dielectric material.

15. The method of forming the semiconductor device of claim 14, wherein the isolation rail is formed of a second dielectric material different than the first dielectric material.

16. The method of forming the semiconductor device of claim 14, wherein a sidewall of the backside power rail abuts against the first dielectric material and wherein a first sidewall of the backside isolation rail abuts against the first dielectric material.

17. The method of forming the semiconductor device of claim 16, wherein a sidewall of the backside ground rail abuts against the first dielectric material and wherein a second sidewall of the backside isolation rail abuts against the first dielectric material.

18. The method of forming the semiconductor device of claim 11, wherein a front surface of the backside ground rail is coplanar with a front surface of the backside isolation rail and wherein a rear surface of the backside ground rail is coplanar with a rear surface of the backside isolation rail.

19. The method of forming the semiconductor device of claim 11, wherein a front surface of the backside power rail is coplanar with a front surface of the backside isolation rail and wherein a rear surface of the backside power rail is coplanar with a rear surface of the backside isolation rail.

20. A transistor comprising:
one or more channel regions;
a gate connected to the one or more channel regions;
a first source or drain (S/D) region connected to the one or more channel regions;
a second S/D region connected to the one or more channel regions;
a first backside contact connected to a bottom surface of the first S/D region and a second backside contact connected to a bottom surface of the second S/D region;
a backside power rail connected to the first backside contact and a backside ground rail connected to the second node; and
a backside isolation rail between the backside power rail and the backside ground rail.

* * * * *